United States Patent [19]

Ichihara et al.

[11] Patent Number: 5,920,481
[45] Date of Patent: Jul. 6, 1999

[54] IC PACKAGE PROCESSING AND MEASURING METHOD AND SYSTEM THEREFOR

[75] Inventors: Masashi Ichihara, Chigasaki; Yoshinori Saito, Kamakura; Masato Suwa, Hiratsuka; Yukihiro Tsuda, Isehara; Hitoshi Kitamura, Naka-gun, all of Japan

[73] Assignee: Komatsu Ltd., Tokyo, Japan

[21] Appl. No.: 08/952,259

[22] PCT Filed: May 15, 1996

[86] PCT No.: PCT/JP96/01279

§ 371 Date: Nov. 12, 1997

§ 102(e) Date: Nov. 12, 1997

[87] PCT Pub. No.: WO96/36456

PCT Pub. Date: Nov. 21, 1996

[30] Foreign Application Priority Data

May 15, 1995 [JP] Japan ................................. 7-116044
May 13, 1996 [JP] Japan ................................. 8-117722

[51] Int. Cl.[6] .................................................. G06F 19/00
[52] U.S. Cl. .............................. 364/468.28; 364/468.23; 364/167.02
[58] Field of Search .................... 364/468.28, 468.23, 364/478.04, 488, 489, 490, 491, 167.02

[56] References Cited

U.S. PATENT DOCUMENTS 4,956,786   9/1990   Drummond et al. .............. 364/474.02

FOREIGN PATENT DOCUMENTS 62-210635   9/1987   Japan .
62-210636   9/1987   Japan .
62-210637   9/1987   Japan .
06312281   11/1994   Japan .

Primary Examiner—William Grant
Assistant Examiner—Chad Rapp
Attorney, Agent, or Firm—Welsh & Katz, Ltd.

[57] ABSTRACT

An IC package processing and measuring system comprises: a processing and measuring device that executes processing or measurement on a prescribed number of IC packages juxtaposed in a prescribed area; a feed device that feeds IC packages into the prescribed area, a prescribed number at a time, by feeding with a prescribed feed pitch an IC package support on which are loaded a plurality of juxtaposed IC packages; and a control device that controls the processing and measuring device and feed device. The control device comprises position calculating means that uses shape data of the IC package and IC package support to calculate target positions of processing and measurement of the IC packages in the prescribed area and outputs the calculated position data to the processing and measuring device. The processing and measuring device comprises processing and measuring means that uses the target position data that were input from the position calculating means to execute processing or measurement on the IC packages that were fed into the prescribed area. Thus improvement of the operability and shortening of the operating time are attained.

7 Claims, 17 Drawing Sheets

IC PACKAGE PROCESSING AND MEASURING METHOD AND SYSTEM THEREFOR

TECHNICAL FIELD

The present invention relates to an IC package processing and measuring system in which there are synchronously operated a processing and measuring device that performs prescribed processing and measurement on a plurality of IC packages juxtaposed on an IC package support such as a lead frame or jig, and a feed device that sequentially feeds a prescribed number of IC packages at a time in respect of a prescribed processing and measuring area of the processing and measuring device by controlling the movement of the IC package support.

BACKGROUND ART

One example of an IC package processing and measuring system of this type is a laser marking system. Such a system is constituted by a combination of a laser marker that sequentially marks product number, date of manufacture, lot number, serial number, etc. onto a plurality of IC packages juxtaposed on a lead frame, using a laser beam, and an IC feed device that sequentially feeds IC packages in respect of a prescribed marking area of the laser marker by feed control of the lead frame on which the IC packages are mounted.

In such a laser marking system, the marking area of the laser marker is a region set up in the maximum region that can be scanned by the laser beam. Marking cannot be performed on IC packages positioned outside the marking area.

Recently however as a consequence of expansion of the marking area due to raising of the performance of the laser marker, improvement in the degree of circuit integration of IC packages fed into the marking area, and miniaturization of the IC packages, laser marking systems are being developed in which a plurality of IC packages can be fed (accommodated) into the marking area at once. Such systems are much more advantageous than systems in which only a single IC package can be fed into the marking area in point of view of processing efficiency, working time, and cost aspects.

However, in a laser marking system capable of feeding a plurality of IC packages into the marking area, due to the relationship between the size or mode of arrangement of the marking area and IC packages, in some cases, the ratio between the number N of ICs carried on a single lead frame and the number n of IC packages that can be accommodated in the marking area (N/n) is not an integer ratio, giving rise to a margin M.

For example, in the case where N=10 and n=4, a margin M=2 is produced. Specifically, in this case, when marking is performed for the first time, of the ten IC packages, marking is performed on a first group of four packages; feeding of the lead frame is performed and the next four IC packages are positioned in the marking area. Marking is then carried out for the second time and the second group of four IC packages are marked. After the, feeding of the lead frame is again performed. At this stage, only the last two IC packages are positioned in the marking area, so an incomplete group is left.

Consequently, in such a case, if the laser marker is controlled in the same way as in the first and second marking, the time required for this ineffective processing represents wasted time that does not contribute to the processing operation; this results in a useless increase in processing and measuring time and gives rise to the inconvenience that the feed portion of the IC feed device and/or the IC packages may be damaged by the laser beam.

Also, conventionally, as the feed distance data of the IC packages employed in the IC feed device, or the position data of the IC packages in the marking area employed by the laser marker, data calculated beforehand were input by the operator manually. There was therefore the problem that not only was it necessary to effect new calculations and input every time the type of the IC package or the type of the lead frame was altered, but also operating efficiency was poor and operation was complicated.

Also, in such a system, if some abnormality of the laser marker or IC feed device occurs during operation of the system, if the mechanism is stopped during the course of the marking process, the lead frame will contain both already-marked IC packages and IC packages awaiting marking. Consequently, in such cases, when restarting the marking operation after repairing the system, it is necessary to perform marking only in respect of the IC packages that are awaiting marking, by designating the IC packages that have not already been marked.

However, in such cases, conventionally, the operator had to designate the required IC packages by re-inputting the position data of the IC packages awaiting marking to the laser marker. This had the problem of being complicated and inefficient.

With the foregoing in view, it is an object of the present invention to provide a system and a method for IC package processing and measurement in which, in cases where an incomplete number of unprocessed IC packages are fed into the processing and measuring area, the processing and measuring action is only executed on the incomplete number of unprocessed IC packages, thereby raising operating efficiency and avoiding damage of the mechanism.

A further object of the present invention is to provide a system and a method for IC package processing and measurement in which ease of operation is increased and operating time is reduced.

DISCLOSURE OF THE INVENTION

In this invention, an IC package processing and measuring system comprises: a processing and measuring device that executes processing or measurement on a prescribed number of IC packages juxtaposed in a prescribed area; a feed device that feeds IC packages into the prescribed area, a prescribed number at a time, by feeding with a prescribed feed pitch an IC package support on which are loaded a plurality of juxtaposed IC packages; and a control device that controls the processing and measuring device and feed device, wherein the control device comprises position calculating means that uses shape data of the IC package and IC package support to calculate target positions of processing and measurement of the IC packages in the prescribed area and outputs the calculated position data to the processing and measuring device; and the processing and measuring device comprises processing and measuring means that uses the target position data that were input from the position calculating means to execute processing or measurement on the IC packages that were fed into the prescribed area.

With the present invention, the control device automatically calculates the target positions of the respective IC packages during processing and measurement, using the shape data of the IC packages and IC package support, and outputs the result of the calculation to the processing and measuring device. The processing and measuring device executes processing or measurement, taking the inputted target position data as a target position for the processing and measurement.

Also, in the present invention, there may be provided in the control device feed distance calculating means that calculates feed distance data in order to feed the IC packages to the target positions calculated by the position calculating means using the shape data of the IC package and IC package support and outputs the calculated feed distance data to the feed device, and there may be provided, in the feed device, a feed control means that executes feed control of the IC packages using the feed distance data input by the feed distance calculating means.

Thus, with the present invention, the control device automatically calculates feed distance data for feed control by the feed device, using the shape data of the IC packages and IC package support, and outputs the result of the calculation to the feed device. The feed device executes feed control of the IC packages using the input feed distance data.

Also according to the present invention, the control device is provided with memory means whereby a number is allocated to each IC package on the IC package support, and the allocated IC package numbers are stored in association with the target position data calculated by the position calculating means, and a means that reads the target position data corresponding to the inputted IC package number from the memory means and that outputs the target position data that has been read to the processing and measuring device.

Thus, with the present invention, the operator can specify an IC package number, and the IC target position data corresponding to this IC package number will then be input to the processing and measuring device, and as a result processing and measurement will be executed only in respect of the IC package of this designated number.

Also in this invention, an IC processing and measuring system comprises: a processing and measuring device that executes processing or measurement on a prescribed number of IC packages juxtaposed in a prescribed area; a feed device that feeds IC packages into the area, a prescribed number at a time, by sequentially feeding an IC package support on which are loaded a plurality of juxtaposed IC packages; and a control device that controls the processing and measuring device and feed device, wherein the control device comprises: position calculating means that uses shape data of the IC package and IC package support to calculate target positions of processing and measurement of the IC packages in the area; processing and measurement indicating data forming means that forms processing and measurement indicating data that indicates whether or not there is to be processing or measurement at the target positions of the IC packages calculated by the position calculating means using data indicating the maximum number and arrangement of the IC packages that are capable of being fed into the area and data indicating the total number and the arrangement of the IC packages that are fed; and means that outputs the calculated target position data and processing and measurement indicating data to the processing and measuring device, and the processing and measuring device comprises processing and measuring means that executes processing or measurement only in respect of target positions where the processing and measurement indicating data indicate that there is to be processing or measurement, based on the target position data and processing and measurement indicating data which have been input.

Thus, with the present invention, the control means uses the IC package and IC package support shape data to calculate target positions for processing and measurement of each IC package in the area. As well as this, the control means uses data indicating the maximum number and arrangement of IC packages that can be fed into the area and data indicating the total number and arrangement of IC packages that have been fed to form data designating processing and measurement indicating whether or not processing or measurement of each IC package at the calculated target positions have been carried out, and outputs these target position data and processing and measurement indicating data to the processing and measuring device. The processing and measuring device executes processing or measurement only in respect of target positions where the processing and measurement indicating data are deemed to provide for processing or measurement. Empty action (processing without a processing object or measurement without a measurement object) is thereby eliminated even in cases where an incomplete number of unprocessed IC packages are fed into the processing and measuring area.

Further, with this invention, in a case where there occurs a condition that the number of IC packages to be fed into the area does not reach the maximum number of the IC packages which are capable of being fed into the area, the feed pitch of IC packages at a state immediately before or immediately after shifting to such a condition is shortened than the prescribed feed pitch so that the feed action can be performed as much efficiently as possible.

As described above, with the present invention, since the feed distance immediately before and after incomplete-number action is shortened than the ordinary pitch, the time required for feeding is shortened and thus the processing ability of processing and measurement can be improved.

BEST MODE FOR CARRYING OUT THE INVENTION

Embodiments of the present invention are described in detail below with reference to the appended drawings.

First of all, a first embodiment in which the present invention is applied to a laser marking system comprising a laser marking device and IC feed device will be described.

Figure 1:
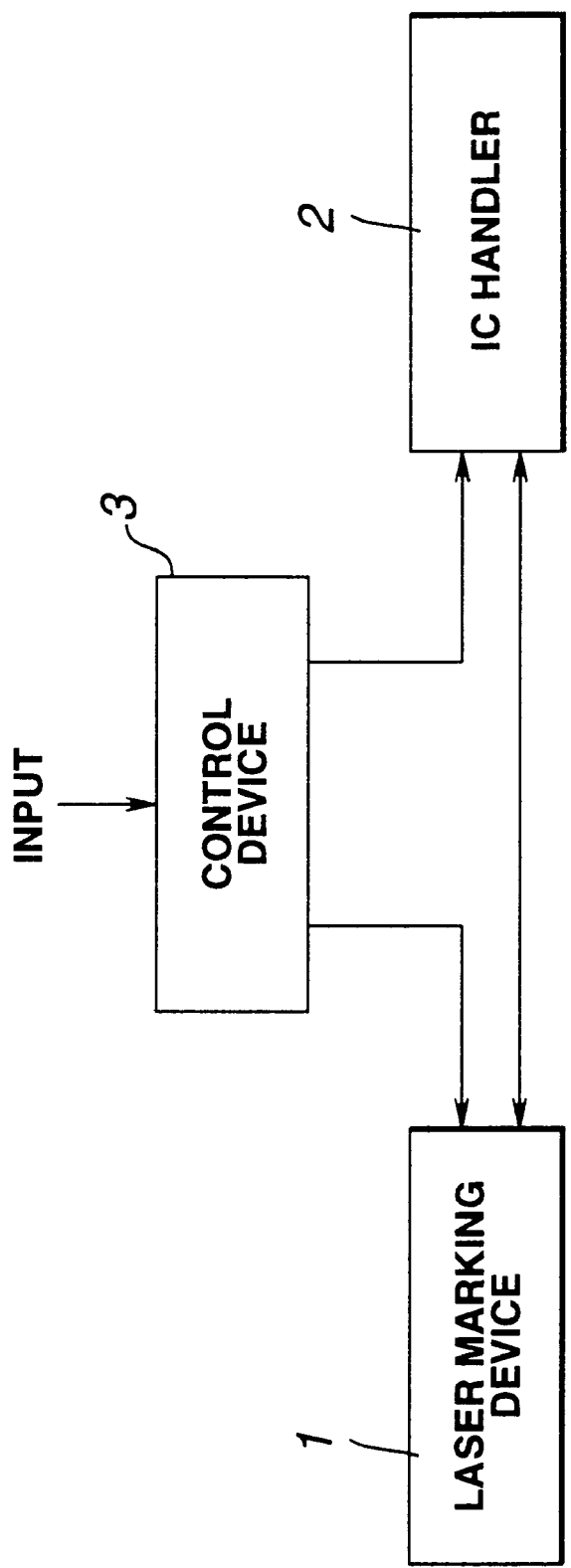
FIG. 1 is a system block diagram of a first embodiment of the present invention.

FIG. 1 shows the overall layout of the system of the first embodiment. The system of this embodiment comprises a laser marking device 1 that marks the required marking pattern on an IC package, an IC feed device 2 (hereinbelow termed an "IC handler") that feeds a lead frame on which a plurality of IC packages are mounted, and a control device 3 that controls the laser marking device 1 and IC handler 2.

Figure 2:
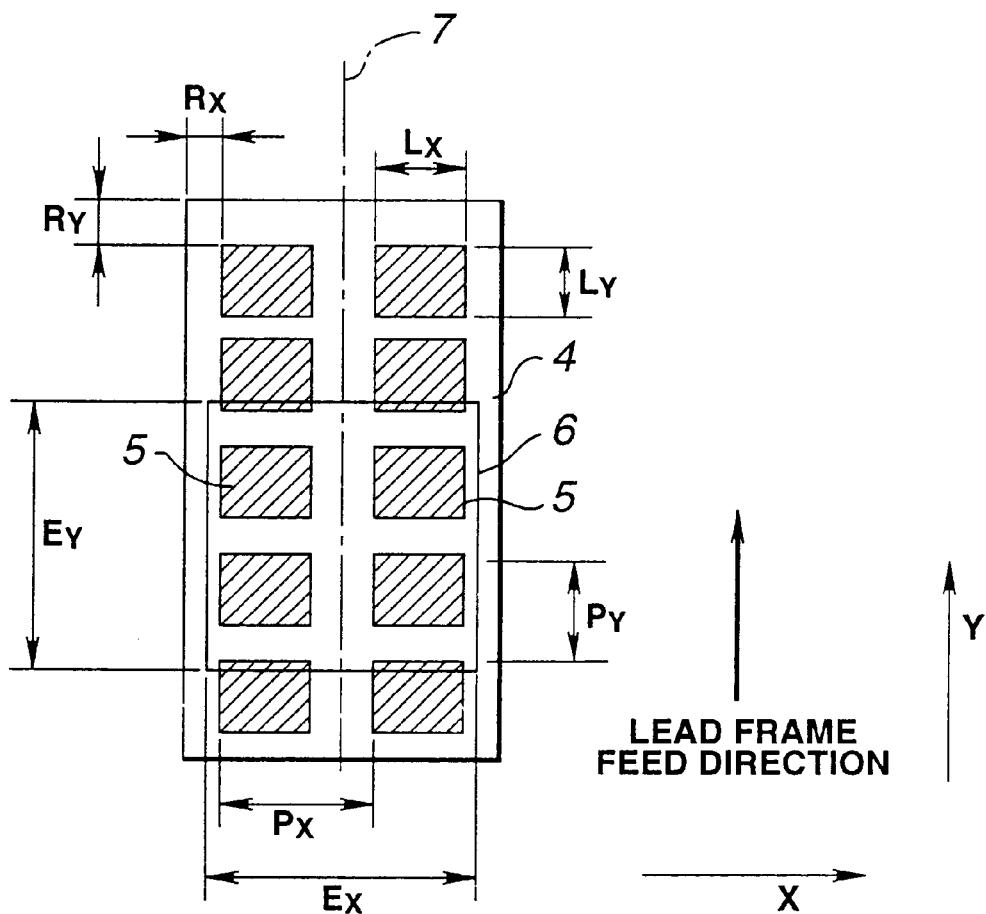
FIG. 2 is a view showing the necessary input parameters during execution of marking.

FIG. 2 shows in plan view a plurality of IC packages 5 (hereinbelow simply called ICs) arranged in order on lead frame 4; in this case, ten ICs 5 are mounted on lead frame 4 in two columns and five rows. In FIG. 2, the rectangular-shaped frame 6 indicates the marking area of laser marking device 1. Marking action is executed by laser marking device 1 on four ICs 5 within the marking area 6. Details of marking area 6 will be explained later.

Laser marking device 1 successively marks the required marking pattern on the four ICs 5 which are positioned in marking area 6. The marking action is executed by directing a laser beam on to an IC package 5 through a liquid crystal mask on which the required marking pattern is displayed. In this case, laser marking device 1 is equipped with a single laser generator and marking action is performed one package at a time by the laser generator.

Figure 3:
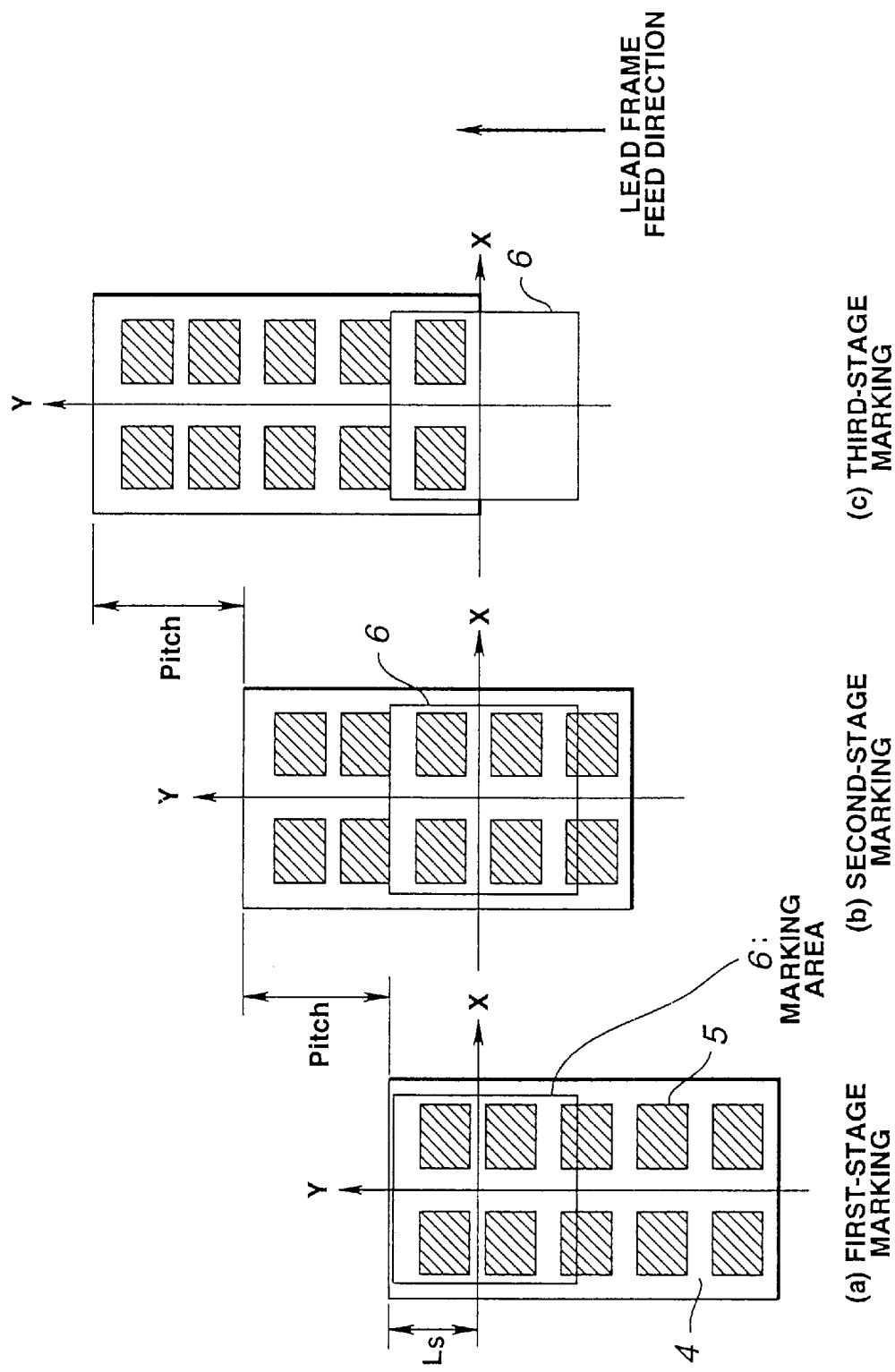
FIG. 3 is a view showing the feed procedure of a lead frame.

IC handler 2 performs feed control of lead frame 4 such as to position four IC packages at a time in the marking area 6. An example of its feed action is shown in FIG. 3. It should be noted that it will be assumed that during lead frame feeding, as shown in FIG. 2, the relative position of laser marking device and IC handler 2 is adjusted such that center line 7 of the lead frame in the direction parallel to the feed direction of lead frame 4 bisects the marking area 6.

The marking action of laser marking device 1 and the feed action of IC handler 2 will be described in outline using FIG. 3.

First of all, IC handler 2 feeds lead frame 4 up to the position where the first four ICs 5 are accommodated within marking area 6, and stops (FIG. 3(a)). In this condition, a first marking action is performed by laser marking device 1, and, as a result, marking is applied to the first four ICs 5. When the marking of these four ICs is completed, IC handler 2 feeds the lead frame 4 up to the position (more precisely by the distance of the feed pitch) at which the next four ICs 5 are accommodated in marking area 6 (FIG. 3(b)) and then stops. In this condition, the second marking action is performed by laser marking device 1, and, as a result, marking is performed on the next four ICs 5. When the marking of these four ICs is completed, IC handler 2 feeds lead frame 4 to a position (more precisely, by a distance of the feed pitch) at which the next two ICs 5 are accommodated in the marking area 6 (FIG. 3(c)) and then stops. In this condition, the third marking action is performed by laser marking device 1, and, as a result, marking is applied to the last two ICs 5.

Next, control device 3 that controls laser marking device 1 and IC handler 2 is equipped with the following functions.

(a) Using the shape data of lead frame 4 and ICs 5, target positions for marking of each IC 5 in marking area 6 are calculated, and these calculated target position data are sent to laser marking device 1. Laser marking device 1 executes the action of marking ICs 5 using the target position data that are input from control device 3.

(b) The shape data etc of lead frame 4 and IC 5 are used to calculate feed distance data for feeding ICs 5 to the calculated target positions and the feed distance data is sent to IC handler 2. IC handler 2 executes feed control of lead frame 4 using the feed distance data input from control device 3.

(c) As shown in FIG. 3(c) referred to above, if marking action is to be performed to mark a number of ICs 5 that on this occasion are less than the maximum number of ICs that can be accommodated in marking area 6 (hereinbelow such an action will be referred to as incomplete-number action) marking action is executed only in respect of those ICs that are positioned within marking area 6: thus "empty action" cannot occur.

(d) IC package designation marking function, in which marking action is executed only in respect of ICs corresponding to designated numbers allocated to the ICs on lead frame 4.

In order to realize this IC package designation marking function, control device 3 is provided with a memory (not shown) that stores the correspondence relationship between the calculated target positions of the ICs in marking area 6 and IC numbers allocated to the ICs on lead frame 4 and is also provided with a function of reading target position data corresponding to an input IC number from memory.

The above functions executed by control device 3 will now be described in detail.

First of all, the various shape data of lead frame 4 and ICs 5 that are input to control device 3 will be described using FIG. 2 and FIG. 4. In this embodiment, the software of control device 3 is constituted such as to input eleven items of shape data as indicated below. The direction perpendicular to the feed direction of lead frame 4 is called the transverse direction (X direction); the direction parallel to it is defined as the longitudinal direction (Y direction). The shape data can be stored beforehand on some suitable storage medium, or could be input every time they are needed.

(1) Transverse direction IC package size: Lx

Length of the IC package in the transverse direction (2) Longitudinal direction IC package size: Ly Length of the IC package in the longitudinal direction (3) Transverse direction IC package pitch: Px Length between adjacent IC packages in the X direction+Lx (4) Longitudinal direction IC package pitch: Py Distance between adjacent IC packages in the Y direction+Ly (5) Total number of IC packages in the transverse direction: Nx Total number of IC packages lined up in the transverse direction on the lead frame In the case of FIG. 2, Nx=2.

(6) Total number of IC packages in the longitudinal direction: Ny

Total number of IC packages lined up in the longitudinal direction on the lead frame In the case of FIG. 2, Ny=5

(7) Transverse direction end distance: Rx

Distance between the lead frame end on the left side towards the feed direction and the IC package positioned most to the left (8) Longitudinal direction end distance: Ry Distance between the lead frame end on the front side towards the feed direction and the most forwardly positioned IC package (9) Transverse direction marking area size: Ex The maximum region that is capable of being scanned by the laser of laser marking device 1 is in fact practically circular, but marking area 6 is defined as the rectangular range contacting this approximate circle internally and with one side parallel to the direction of feed of lead frame 4. The length of the side of the marking area 6 perpendicular to the feed direction of lead frame 4 is defined as the size of the marking area in the transverse direction.

It should be noted that, in this embodiment, in order to simplify the construction of IC handler 2, movement of lead frame 4 is impossible in the X direction. Consequently, with such an IC handler 2, the minimum value of Ex is restricted by the following expression:

$$Ex \geq Rx + Px \times (Nx-1) + Lx$$

Accordingly, a value obtained by adding a margin to take into account the effect of feeding error etc is added to the Ex found by the above expression and this is taken as Ex. Of course, in determining Ex by the above expression, consideration is given such that it does not exceed the maximum region capable of being scanned by the laser.

(10) Longitudinal direction marking area size: Ey

Length of the side of marking area 6 parallel to the feed direction of lead frame 4

(11) Distance: Lstart (see FIG. 4)

Distance between the leading edge of the lead frame and the center o of the marking area in the stand-by position before feeding of the lead frame.

Lstart is the distance between the position of the lead frame in the storage box and the center of the marking area in the case of a construction wherein the IC handler feeds lead frames from the storage box in which a plurality of lead frames are stored into the marking area of laser marking device 1 directly. In the case of a construction wherein the IC handler extracts leads frames one at a time from the storage box and transports them to the lead frame stand-by position prior to feeding, so that they are temporarily stopped before feeding to the marking area, it is the distance between this stand-by position and the center of the marking range.

Next, control device 3 calculates the parameter of item 12 indicated below, using the shape data of item 11 that has been input.

(i) Absolute identification number of IC

Figure 5:
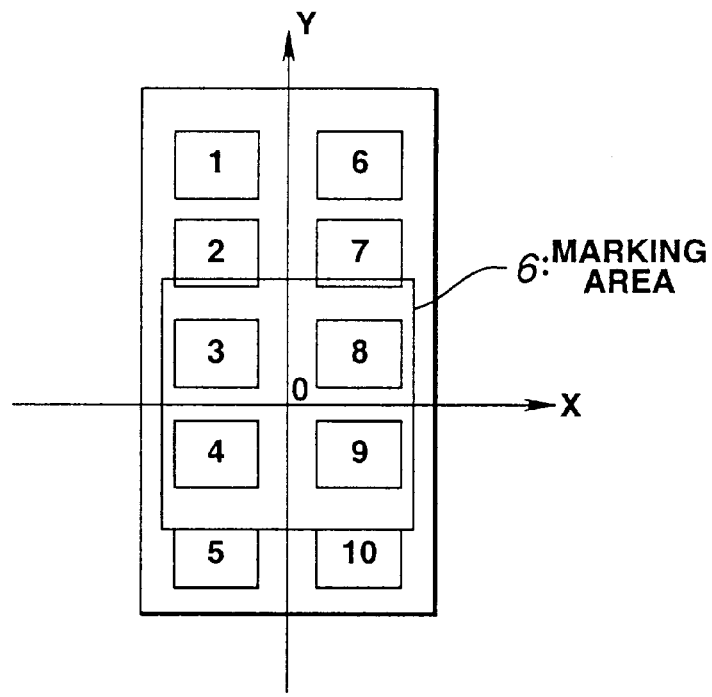
FIG. 5 is a view showing an example of the way in which absolute identification numbers are allocated to ICs on a lead frame.

As shown in FIG. 5, an absolute identification number is allocated to all of the ICs 5 on a single lead frame 4. In this embodiment, the method of allocating these numbers is as follows. This absolute identification number is used for the IC package-designated marking function referred to above, in which marking action is executed only in respect of ICs of number designated by the operator.

The IC at the left top end is given the number "1"

Numbers are allocated in sequence in the longitudinal direction

When this column is finished, the numbering shifts to the next column on the right, and numbers are allocated continuously from top to bottom.

(ii) Distance: Ls (see FIG. 3(a))

Distance between the front edge of the lead frame and the point of origin o of the marking area in the marking position of lead frame 4 during the first marking. The point of origin o is the position that respectively bisects the marking area 6 in the X direction and the Y direction.

The distance Ls is calculated as follows.

$$Ls = Py \times (Ney-1)/2 + Ly/2 + Ry \quad (1)$$

Ney is a parameter to be described.

(iii) The number of packages in the transverse direction (X direction) entering the marking area: Nex This Nex can be calculated as the maximum Nex satisfying the following expression, when an IC handler is employed that is capable of moving in the X direction.

$$Px \times (Nex-1) + Lx \leq Ex \quad (2)$$

However, when an IC handler is employed that is not capable of moving in the X direction, Nex=Nx, and, in the present specific example, Nex=2.

(iv) Number of packages in the longitudinal direction entering the marking area: Ney This is calculated by the following expression. Specifically:

$$Py \times (Ney-1) + Ly \leq Ey \quad (3)$$

The maximum Ney satisfying this is selected as the Ney value. In the specific case of the present occasion, Ney=2.

Figure 6:
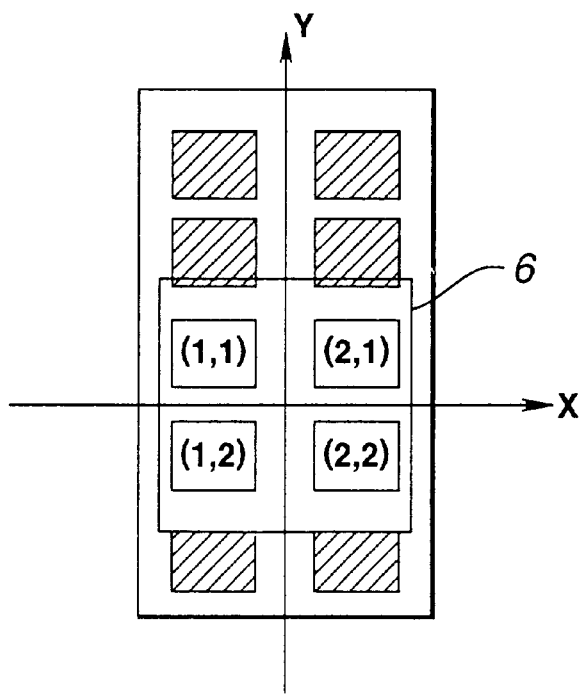
FIG. 6 is a view showing an example of the manner of allocating IC identification numbers in the marking area.

(v) Identification numbers of IC packages in marking area (see FIG. 6)

Identification numbers are allocated as follows to each of the IC packages Nex×Ney entering the marking area.

Make the identification number of the package at the top left of the marking area (1, 1).

Allocate the identification numbers (1, 2), (1, 3) in sequence to the ICs lined up in the longitudinal direction.

When the numbering reaches (1, Ney), shift to the next column on the right, and allocate the top IC the identification number (2, 1).

Allocate the identification numbers (2, 2), (2, 3) in sequence to the ICs lined up in the longitudinal direction.

When the numbering reaches (2, Ney), shift to the next column on the right, allocating to the topmost IC the identification number (3, 1).

Continuing the allocation of identification numbers by the same procedure, terminate the allocation process at identification number (Nex, Ney).

The present specific example is illustrated in FIG. 6.

(vi) Position of each IC in marking area 6:

Pk,l(x,y)

Figure 7:
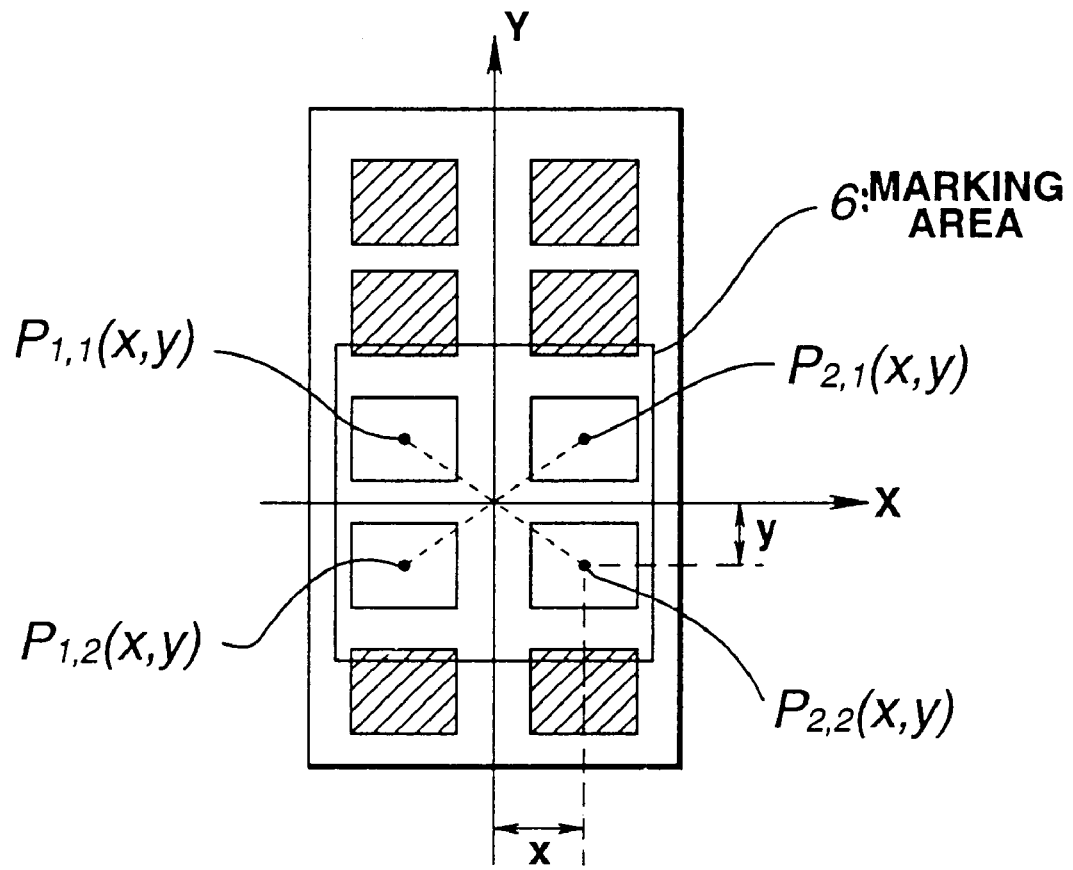
FIG. 7 is a view showing the position data of ICs in the marking area.

The position of each IC in the marking area 6, as shown in FIG. 7, is represented by Pk,l(x,y) when the center of each IC is positioned at x mm in the transverse direction and at y mm in the longitudinal direction, taking the center o of the marking area as the origin.

Pk,l(x, y) is determined as follows.

If the number of ICs is 1, this IC is positioned at the center o of the marking area. That is, the position of the IC package is expressed by P1,1 (0,0).

Also, as shown in FIG. 7, if the ICs are arranged such that the point of intersection of the diagonals of the centers of the ICs coincides with the origin o of the marking area, the position of the top left IC can be expressed by the following expression.

$$P1,1\ (-Px \times (Nex-1)/2,\ Py \times (Ney-1)/2)$$

Also, the position of the IC package whose IC identification number is (k,l) can be represented as follows.

$$Pk,1\ (-Px \times (Nex-1)/2 + Px \times (k-1),$$

$$Py \times (Ney-1)/2 - Py \times (l-1)) \quad (4)$$

(vii) Feed Pitch: Pitch

As shown in FIG. 3, this is the feed pitch of the lead frame fed by IC handler 2, and may be calculated as follows.

$$\text{Pitch} = Py \times Ney \quad (5)$$

(viii) Whether or not there is incomplete-number marking: umu

This may be calculated as follows

When mod $(N/n)=0$, $umu=0$

When mod $(N/n) \neq 0$, $umu=1$ \quad (6)

Where mod (N/n) is the function that expresses the remainder of N/n. Also, N is the total number of ICs on lead frame 4, and is N=Nx×Ny. Also, n is the maximum number of ICs that can be accommodated in the marking area. n=Nex×Ney.

Consequently, when umu=0, there is no "incomplete-number action" and when umu=1, incomplete-number action will occur.

In the specific example illustrated in FIG. 2, umu=1.

(ix) Number of times of marking: kaisuu

This number of times of marking is the number of times required for marking all the ICs on a single lead frame, when the number of times of marking required to mark the ICs in the marking area is taken as 1. It may calculated as follows.

$$kaisuu = \text{Int}(N/n) + umu \quad (7)$$

Where Int (f) is a function representing the integer part of f. In the present specific example, as shown in FIG. 3, kaisuu=3.

(x) Number of ICs in the case of incomplete-number action: kosuu

This may be calculated as follows.

$$kosuu = \text{mod}(N/n) \quad (8)$$

In the case of the present specific example, as shown in FIG. 3, kosuu=2.

(xi) Marking designation data: M(a, b)

The marking designation data is binary data for instructing laser marking device 1 whether marking is to be actually carried out or not at each position in the marking area (in this specific example, four positions) designated by the IC position data Pk,l(x,y) above, and is 1 if marking is to be actually performed, or 0 if marking is not to be performed. Consequently, if the marking indicating data indicating whether or not marking is to be performed at the position represented by IC identification number (a, b) is taken as being M(a, b), the Nex×Ney marking-indicating data within the marking area are as follows.

M(1,1), M(1,2), M(1,3), . . . M(1,Ney), M(2,1), M(2,2), M(2,3), . . . M(1,Ney), M(3,1), . . . M(Nex, Ney).

For example, if marking is to be performed on all the IC packages, this data will be Nex×Ney 1's in a line, i.e. 111111111 . . . 11. Marking-indicating data indicating that marking is to be performed on all the positions in the marking area in this way is called "ordinary marking-indicating data".

As shown in FIG. 3, when carrying out the first and second marking, marking is performed at all the positions, so the ordinary marking-indicating data will be of four 1's i.e. 1111. Also, in contrast to this, when marking is performed for the third time in FIG. 3, marking is only carried out at the upper two positions; incomplete-number action is performed such that marking is not carried out at the two lower positions. The marking-indicating data for this will be 1010. The marking-indicating data for such incomplete-number action is called "incomplete-number marking-indicating data".

Figure 8:
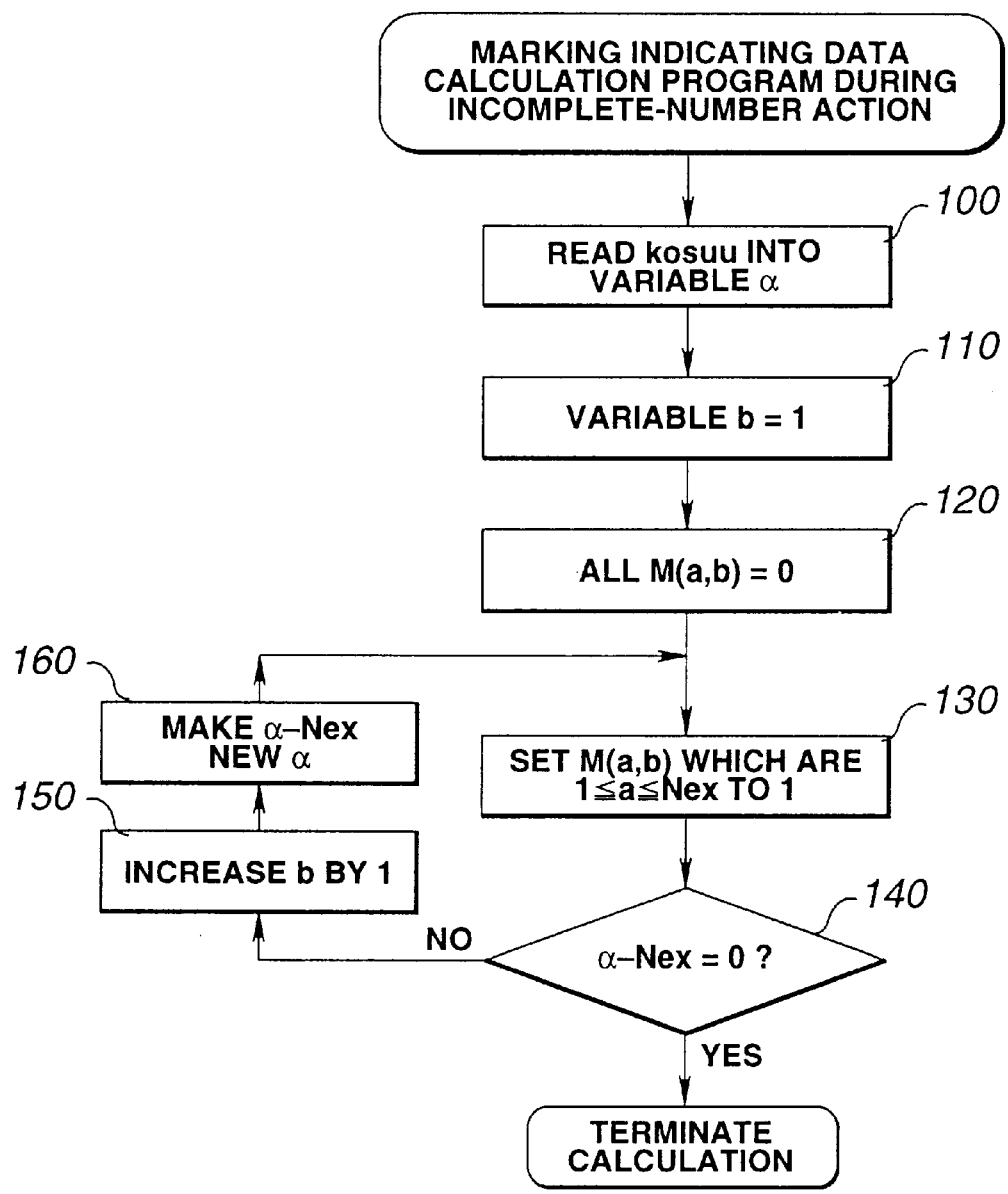
FIG. 8 is a flow-chart of a method of calculating marking indicating data in the case of incomplete-number action.

The flow chart of FIG. 8 shows the algorithm of the software in control device 3 for automatically compiling incomplete-number marking-indicating data.

When compiling the incomplete-number marking-indicating data, control device 3 first of all reads the number of ICs (kosuu) on which incomplete-number action is to be performed found by expression (7) above into a prescribed variable parameter α (step 100). Next, it makes another variable b equal to 1 (step 110), and makes all the marking-indicating data M(a, b) that are to be compiled, without exception, equal to zero (step 120). Specifically, in the case of the incomplete-number action shown in FIG. 3(c), at this stage, M(1, 1)=0, M(1, 2)=0, M(2, 1)=0 and M(2, 2)=0.

Next, control device 3 makes all the marking-indicating data M(a, b) which have a variable a for which $1 \leq a \leq Nex$ i.e. the ICs in the first transverse row all equal to 1 (step 130). As a result, in the incomplete-number action case shown in FIG. 3(c), the marking-indicating date M(1, 1) and M(2, 1) of positions corresponding to ICs in the first transverse row are made 1.

Next, control device 3 subtracts the number Nex found from expression (2) above from the current variable α; if the result of this subtraction is 0, the procedure terminates at this point (step 140). In the case of the incomplete-number action shown in FIG. 3(c), α=kosuu=2 and Nex=2, so the result of the subtraction of step 140 is zero, and the procedure thereupon terminates. As a result, in the case of the incomplete-number action shown in FIG. 3(c), incomplete-number marking-indicating data M(1, 1)=1, M(1, 2)=0, M(2, 1)=1, M(2, 2)=0 will be obtained.

In contrast, if the result of the subtraction performed in step 140 is not 0, the procedure goes to step 150. The case that the result of the subtraction performed in step 140 is not 0 will arise for example if marking is performed with a laser marking device having a marking area capable of accommodating six ICs 5 in two columns of three rows, using a lead frame 4 on which are mounted ten ICs 5 in two columns of five rows just as shown in FIG. 3. In this case, when the second marking is performed after the first marking has been completed, four ICs consisting of two columns of two rows are fed into a marking area that can accommodate six ICs 5 in two columns of three rows. In this case, α=kosuu=4 and Nex=2, so, at the stage where the processing of step 130 has been completed once, the result of the subtraction of step 140 will not be 0, and the procedure will go to step 150.

In step 150, control device 3 adds 1 to variable b, then takes as the new variable a the value found by calculating α−Nex, and again executes the procedure of step 130 described above. For example, in the case of a marking area that can accommodate six ICs 5 in two columns and three rows as described above, the result of the calculation in step 160 is that α=kosuu=4, and Nex=2, so 4−2=2, and the value 2 is made the new variable α. Also, in step 150, variable b is incremented by 1, becoming 2, so in the step 130 that is executed for the second time, the marking-indicating data M(2, 1) and M(2, 2) of the positions corresponding to the second transverse row of ICs are changed from 0 to 1.

Next, control device 3 again executes the procedure of step 140. In this case, α has been changed to α=2, so the result of the subtraction in step 140 is 0, and the procedure terminates at this point. As a result, in the case of a marking area that can accommodate six ICs 5 in two columns of three rows as described above, incomplete-number marking-indicating data M(1, 1)=1, M(1, 2)=1, M(1, 3)=0, M(2, 1)=1, M(2, 2)=1, and M(2, 3)=0 are obtained.

Next, the processing for compilation of marking-indicating data: M(a, b) when an IC package-designating marking function is performed that executes the marking action only on ICs corresponding to the absolute identification numbers specified by the operator will be described.

Based on the transverse direction IC package total number Nx, the longitudinal direction IC package total number Ny, the number Nex of packages in the transverse direction entering the marking area, and the number Ney of packages in the longitudinal direction entering the marking area, control device 3 decides which IC position is specified and in which marking step the marking is to be performed of the ICs (see FIG. 5) corresponding to the absolute identification numbers specified by the operator, and thereby compiles marking-indicating data M(a, b) corresponding to the absolute identification numbers specified in accordance with this decision. For example, in FIG. 5, if IC packages of absolute identification numbers "1", "3" and "5" are specified, marking-indicating data consisting of the data series: "1000100010" is compiled.

Control device 3 sends to laser marking device 1 and IC handler 2 the eleven items of shape data that were input by the operator as well as the required parameters, of the aforesaid eleven parameters, that were calculated by control device 3.

The parameters sent to the laser marking device 1 are as follows.

(vi) Position data of each IC in the marking area: Pk,l (x,y)

(viii) Whether or not incomplete-number marking is to be carried out: umu (xi) Marking-designating data: M(a, b)

IC package-designating marking function execution flag and the marking-indicating data M(a, b)

The parameters sent to IC handler 2 are as follows.

(11) Distance data: Lstart (see FIG. 4)

(ii) Distance data: Ls (see FIG. 3(a))

(vii) Feed pitch: Pitch (ix) Number of times of marking: kaisuu

Figure 9:
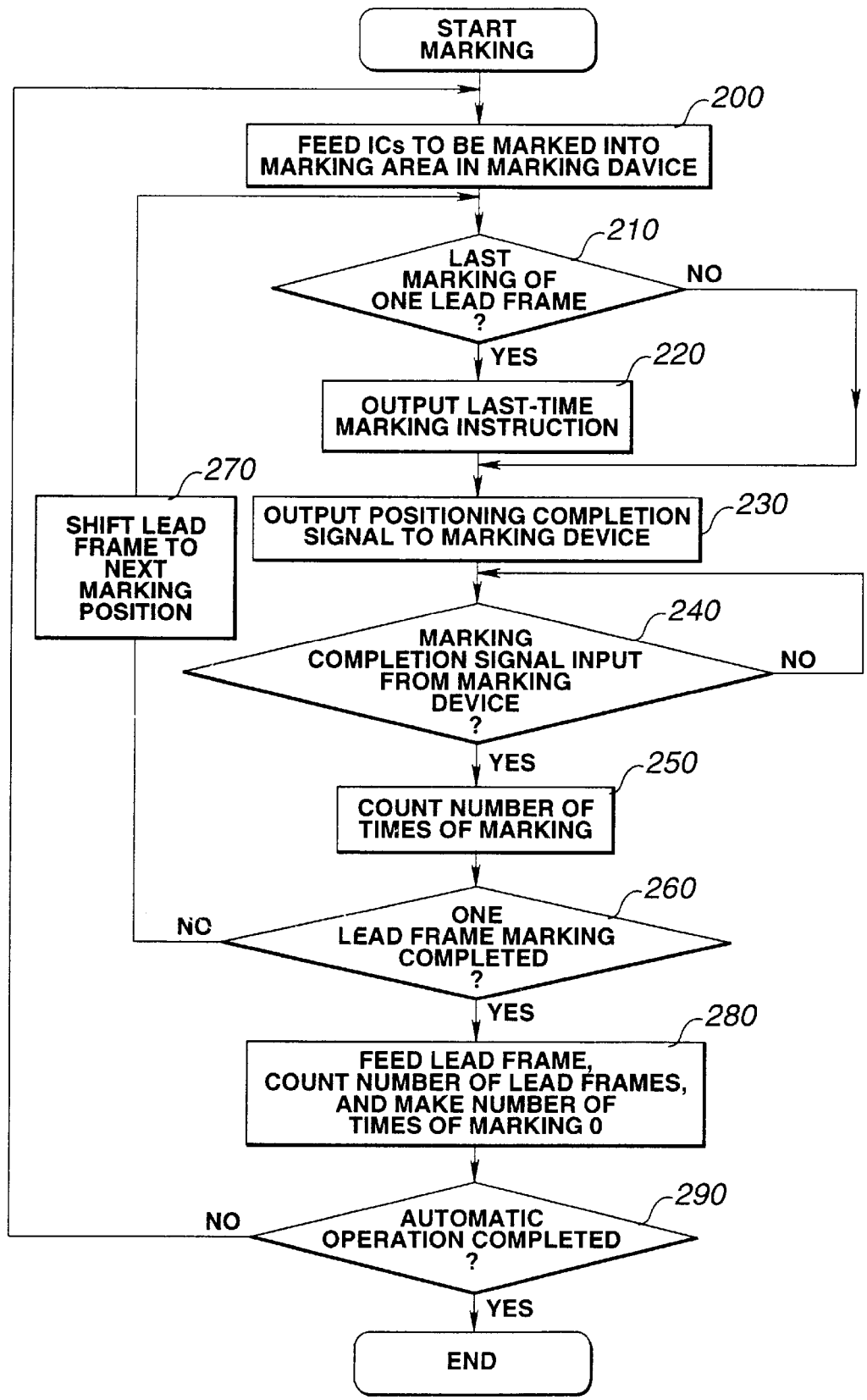
FIG. 9 is a flow-chart showing a control procedure of an IC handler.

FIG. 9 shows a control program that is executed in IC handler 2. Hereinbelow, the action of IC handler 2 will be described with reference to the flow chart of FIG. 9.

Figure 4:
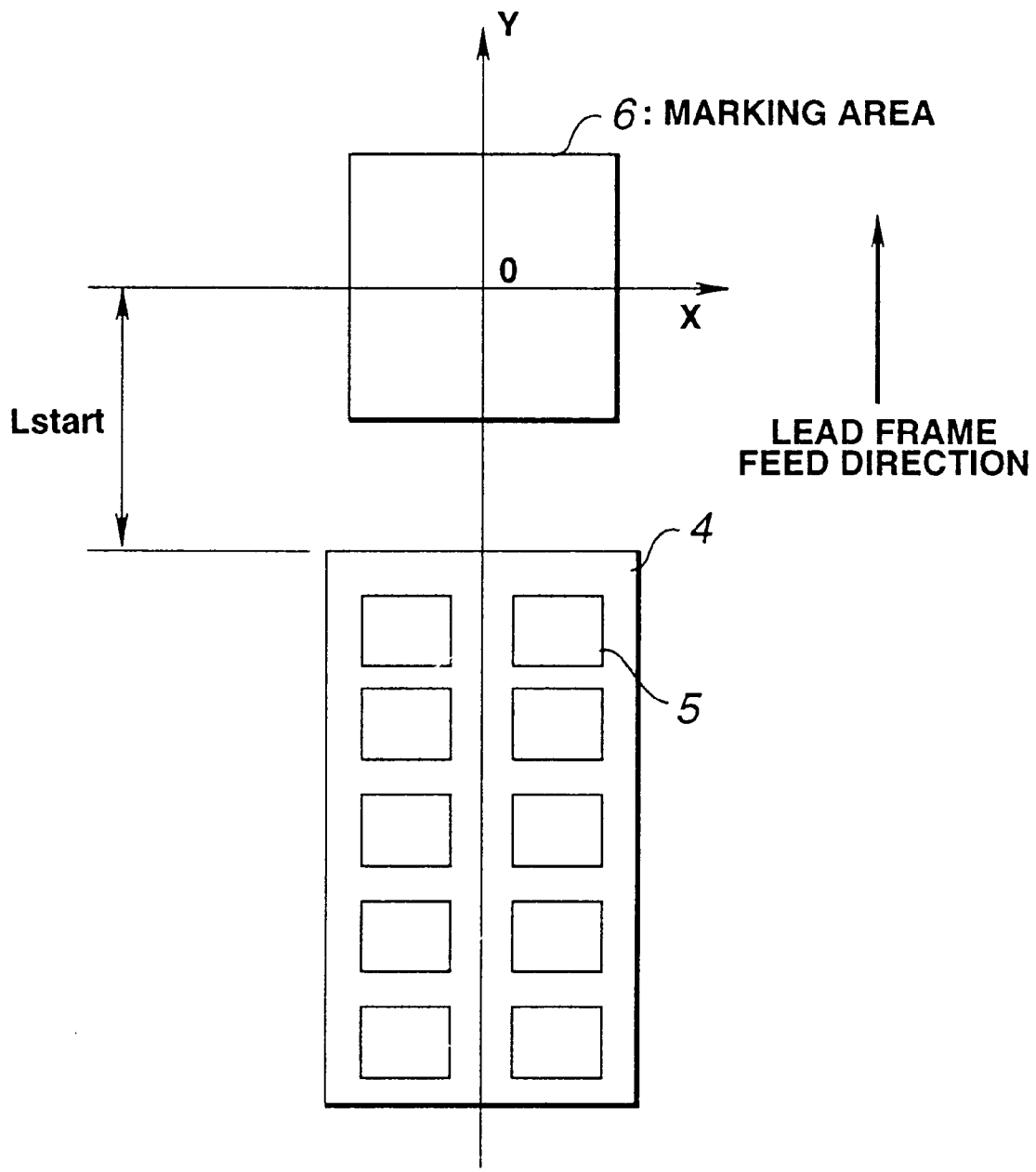
FIG. 4 is a diagram of Lstart.

When the system is started up, first of all, IC handler 2 feeds lead frame 4 through the distance (Lstart+Ls) from the stand-by position before feeding, and then stops it (step 200, see FIG. 3 and FIG. 4). Thereby, as shown in FIG. 3(a), the ICs on which the first marking is to be performed on lead frame 4 are fed into marking area 6.

Next, IC handler 2 establishes whether or not the final marking action is to be performed on one lead frame by the presently executed marking operation (step 210). Specifically, IC handler 2 incorporates a counter that counts the number of times of marking. It ascertains whether or not the count value CT of this counter agrees with the number of times of marking (kaisuu) that is input from the control device 3. If it does agree, it outputs a final-time marking instruction to laser marking device 1 (step 220); if it does not agree, step 220 is skipped and the procedure goes to the following step 230.

In step 230, IC handler 2 recognizes that the feed action has been completed in step 200, and outputs a "position determination completed" signal to laser marking device 1.

In response to the input of the "position determination completed" signal from IC handler 2, laser marking device 1 executes the marking action; when the laser marking device has completed its marking action, it outputs a "marking completed signal" to IC handler 2.

When it inputs the marking completion signal from laser marking device 1 (step 240) IC handler 2 increments the count value CT of the number of times of marking by +1 (step 250); it then determines (step 260), by a comparison of the count value CT with the number of times of marking (kaisuu) input from control device 3, whether or not the marking has been completed for all of a single lead frame 4.

In response to this decision, if not all the marking of one lead frame has been completed, IC handler 2 feeds and stops lead frame 4 by the amount of the feed pitch (Pitch) that it inputs from control device 3; as shown in FIG. 3(b), the ICs that are to be the subject of the second marking on lead frame 4 are thereby fed into marking area 6 (step 270). Subsequently, in the same way as described above, all the ICs in one lead frame are marked by repetition of the procedure of steps 210 to 270. It should be noted that even if, as shown in FIG. 3(c), lead frame 4 is fed in an incomplete-number action condition, for example, the feed distance in step 270 will be equal to the feed pitch (Pitch) as in the other cases.

In this way, when marking has been completed for all of a lead frame (step 260), IC handler 2 feeds this lead frame and then increments the processed lead frame count DCT by +1 and initializes the count CT of the number of times of marking to zero (step 280).

Next, IC handler 2 ascertains whether system operation is to be terminated or not (step 390) by for example checking whether the storage box that stores the lead frames is empty or not or checking whether the count DCT of processed lead frames has reached a set value; if operation is not to be terminated, the procedure returns to step 200 and the procedure described above is repeated. If in step 290 it ascertains that operation is to be terminated, the entire process is terminated at this point.

The above is a description of the action of the control program operating within IC handler 2.

Figure 10:
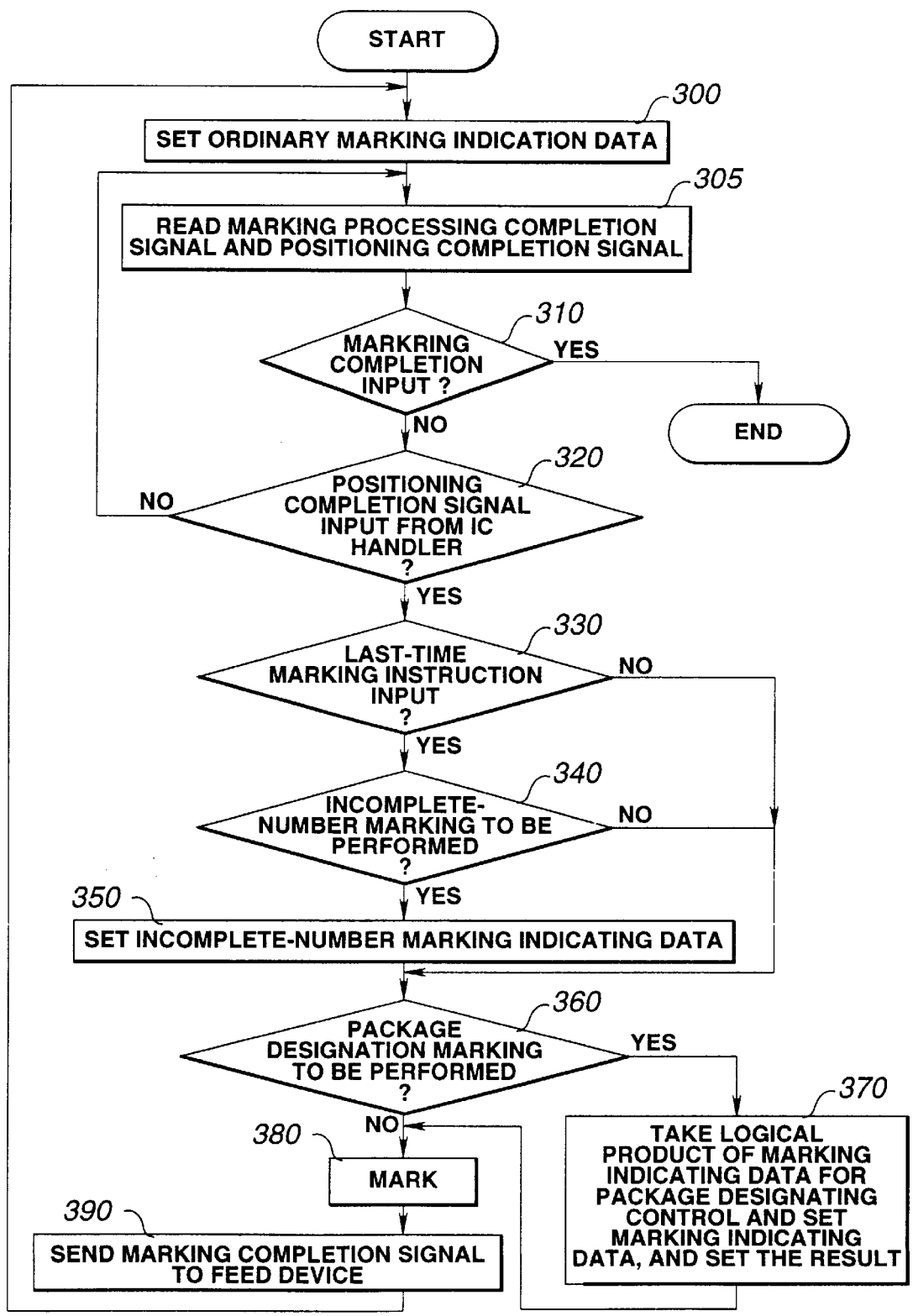
FIG. 10 is a flow-chart showing a control procedure of a laser marking device.

Next, the control program executed in laser marking device 1 is shown in FIG. 10. The action of laser marking device 1 will now be described with reference to the flow chart of FIG. 10.

As described above, control device 3 inputs the following parameters to laser marking device 1.

(vi) Position data of each IC in marking area: Pk,l (x,y)

(viii) Whether or not there is incomplete-number marking: umu (xi) Marking-indicating data: M(a, b)
Flag for execution of IC package-designating marking function and the marking-indicating data for the M(a, b)

The action of the laser marking device 1 will now be described, taking as an example the case where the marking shown in FIG. 3 is performed. Also, first of all, the case where the IC package-designating marking function is not performed will be described.

When the system starts up, laser marking device 1 sets the ordinary marking-designating data M(a, b) that were input from control device 3 as data for compilation of marking positions (step 300). For example, in the case of the marking indicated in FIG. 3 above, as ordinary marking-designating data, a series of four 1's "1111" is input and this "1111" is set.

Next, laser marking device 1 operates to attempt to read the marking processing completion signal from the operator and the position location completed signal from IC handler 2 (step 305). The marking processing completion signal is a signal from a switch mounted for example on the laser marking device; this switch is closed by the operator when all the processing of the packages has been completed. The marking processing completion signal may be formed by the control device 3, or may be input from another externally connected device.

If the marking processing completion signal is input, laser marking device 1 thereupon stops the device; if it has not been input, its stands by until the next position determination completed signal is input from handler 2 (step 320). Specifically, taking as an example the case shown in FIG. 3, when lead frame 4 has been fed into the condition shown in FIG. 3(a), IC handler 2 sends to laser marking device 1 a first position determination completion signal.

If a position determination completed signal is input from IC handler 2, laser marking device 1, next, ascertains whether or not a last-time marking instruction has been input from IC handler 2. In the condition shown in FIG. 3(a), no last-time marking instruction has been issued from IC handler 2, so, after this, the procedure skips steps 340 and 350 and goes to step 360, where it ascertains whether or not package-designating marking is to be performed. In this case, it is assumed that package-designating marking is not to be performed, so the procedure next goes to step 380.

In step 380, laser marking device 1 actually executes the marking action. That is, using the ordinary marking-indicating data that have been set in step 300 above and the position data Pk,l (x,y) of each IC in the marking area that have been input from control device 3, it forms the marking position data for the current-stage marking, and performs marking action in respect of the positions indicated by the marking position data that has thus been formed. In the case of the first marking shown in FIG. 3(a), ordinary marking-indicating data "1111" consisting of a series of four 1's has been set in respect of the four IC position data input from control device 3, so all these four IC position data are selected, and marking is executed sequentially in respect of each IC position. Thus, when performing the marking action of step 380, IC position data is extracted in respect of which the marking-indicating data is 1, and processing to effect marking of the required marking image is performed at the positions corresponding to the position data in respect of all the ICs whose marking-indication data is 1.

Thus, when the first marking action is completed, laser marking device 1 sends a "marking completed" signal to IC handler 2 (step 390). When IC handler 2 receives the marking-completed signal, it feeds lead frame 1 in the amount of the prescribed feed pitch, Pitch, causing the IC for the second marking stage to be fed into marking area 6.

After this, proceeding in the same way as described above, the procedure of steps 300, 305, 310, 320, 330, 360, 380, and 390 is executed, thereby performing marking on the ICs for the second-stage marking shown in FIG. 3(b).

Next, as shown in FIG. 3(c), when carrying out the final marking on the one lead frame, a last-stage marking instruction is input to laser marking device 1 from IC handler 2.

Input of the last-stage marking instruction is detected by laser marking device 1 in the procedure of step 380. When laser marking device 1 detects the input of the last-stage marking instruction, it then decides whether or not incomplete-number marking is to be performed, depending on whether the incomplete-number marking yes/no data that is input from control device 3 umu is 1 or 0.

Next, if incomplete-number marking is to be performed, the incomplete-number marking designation data N(a, b) that is input from control device 3 is set as data for marking position compilation (step 350). In for example the case of incomplete-number marking shown in FIG. 3(c) above, "1010" is set as the incomplete-number marking designation data.

In actual marking when such incomplete-number marking designation data "1010" has been set, in accordance with the incomplete-number marking designation data "1010", only the position data of the first row out of the four IC position data Pk,1 (x,y) are selected, and marking is executed only in respect of the positions corresponding to these selected position data (step 380). Thus, in incomplete-number marking, marking processing is performed only in respect of positions where an IC is actually present.

Next, the action of laser marking device 1 will be described in the case where the IC package-designating marking function is executed that executes marking only in respect of specific ICs, under the control of the operator.

In this case, laser marking device 1 determines whether or not this function is to be exacted in accordance with the IC package-designating marking function flag, which is input from control device 3, in step 360. Thus, when this function is to be executed, the logical product is taken of the marking-indicating data that has been already set in the processing of step 300 or step 350 and the marking-indicating data for executing the IC package-designating marking function that has been input from control device 3, and the result is set.

For example, when, in FIG. 5, IC package of absolute identification number "1" is designated, marking-indicating data consisting of the data sequence "1000000000" is input from control device 3. Also, in the first-stage marking, since the ordinary marking data "1111" are set in step 300, when the logical product of these data is taken, the result is "1000". Consequently, in such a case, when the first-stage marking is performed as shown in FIG. 3(a), in step 380, only the IC of absolute identification number "1" is marked: marking is not performed in respect of the other ICs of absolute identification numbers "2", "6", and "7". Also, in this case, when the second-stage or third-stage marking is performed as shown in FIG. 3(b) or FIG. 3(c), since the result of taking the logical product was in all cases 0 i.e. "0000", in step 380 marking is not performed, and, after this, a marking-completed signal is output to IC handler 2.

In this way, marking can be performed in respect solely of the ICs that have been designated by the operator.

The above is a description of the action of the control program operating in the interior of laser marking device 1.

Thus, with the first embodiment of the present invention, when an incomplete number of unprocessed IC packages are fed into the marking area, marking and measuring action is executed solely on this incomplete number of unprocessed IC packages. "Empty action" is thus eliminated, thereby raising operating efficiency, and avoiding damage to the mechanism. Also, since the control device incorporates an automatic calculating function of the target position data of each IC and an automatic calculation function of the feed distance data for the lead frame, the laser marking device 1 and IC handler 2 can be driven and controlled in accordance with these calculated data, so ease of operation and operating efficiency are raised, and operating time is shortened. Also, since there is incorporated an IC package-designating marking function whereby processing and measurement can be performed exclusively in respect of IC packages that have been designated by the operator, in cases where processing and measurement has been interrupted due to a system malfunction, or cases of repair being carried out, it is possible to designate easily ICs that have not yet been processed; thus ease of operation is very greatly improved.

Next, a second embodiment of the present invention will be described. In the second embodiment, IC handler 2 is altered in construction to a handler wherein jigs that are capable of fixing a plurality (u) of small IC packages cut away from the lead frame are successively fed into or withdrawn from the marking area of laser marking device 1, one at a time. In this case, it is assumed that the marking area of the laser marking device can accommodate all the plurality u of IC packages on the jigs. In this connection, if we let the total number of IC packages after cutting away from the lead frame be U (>u), if there is no integer ratio relationship between U and u, the problem regarding incomplete-number marking as described above is produced.

Specifically, in this case, the number of IC packages fixed to the last jig is not the full value u.

Accordingly, in the second embodiment, empty action is avoided as in the case of the first embodiment above, by storing the marking position data in respect of the last jig separately from the ordinary marking data of the others, and changing over with the marking position data.

Specifically, in the second embodiment also, just as in the first embodiment above, by using the position data $P_{k,l}(x,y)$ of each IC package when there is a full complement of IC packages, the ordinary marking-indicating data for ordinary marking, and the last-jig marking-indicating data $M(a,b)$ for the marking on the final jig, even when incomplete-number action takes place with the final jig, marking processing is only executed on positions where there are actually ICs present.

Figure 11:
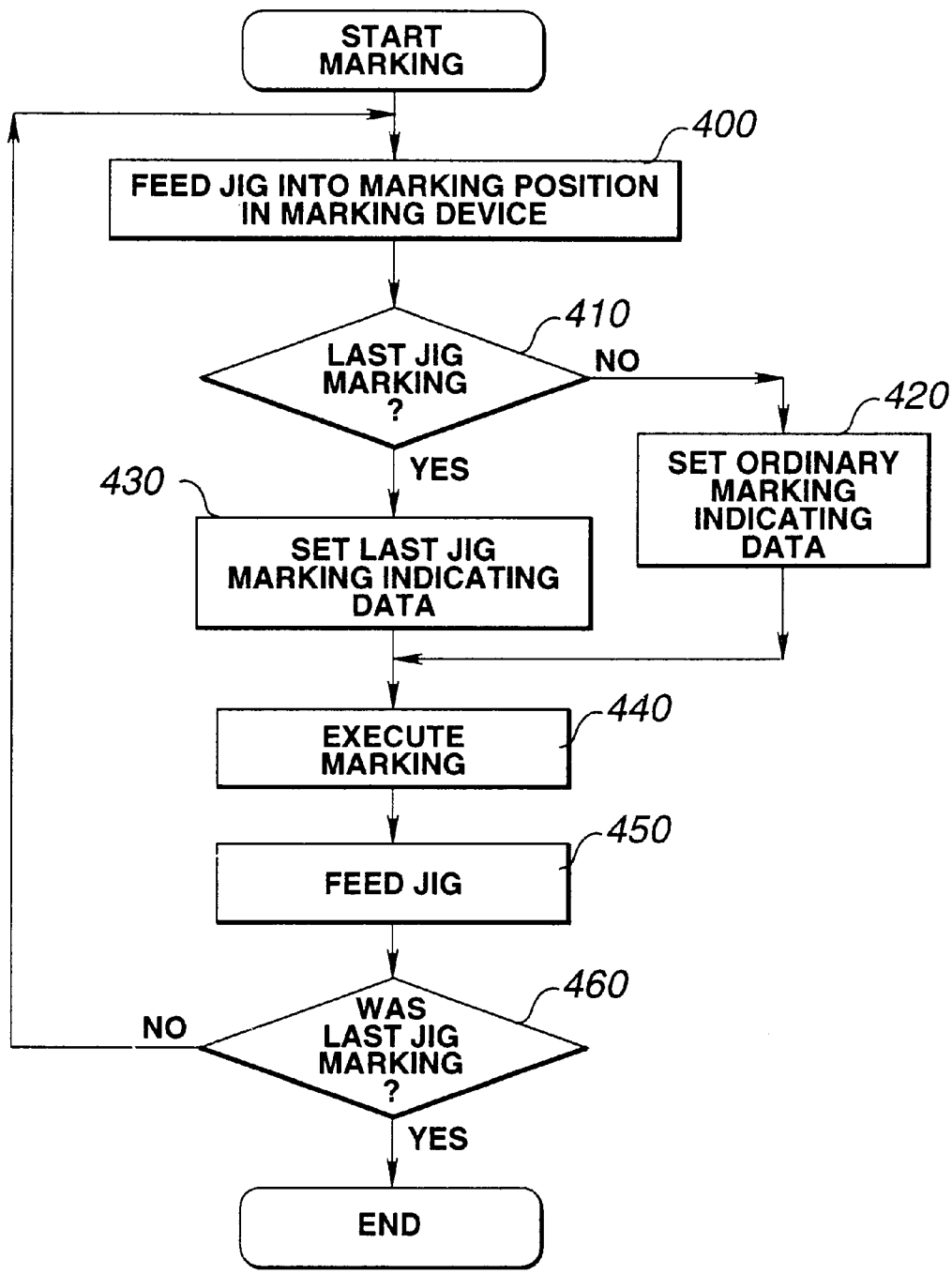
FIG. 11 is a flow-chart showing a second embodiment of this invention.

The action of the second embodiment will now be described with reference to the flow chart shown in FIG. 11.

When the system is started up, the first jig is fed into the marking area within the laser marking device (step 400).

Next, a decision is made as to whether or not the current-stage marking is marking using the final jig (step 410); if it is not marking with the final jig, ordinary marking-indicating data is set (step 420). And if the marking is marking in respect of the last jig, the last-jig marking-indicating data is set (step 430).

Next, in step 440, the actual marking action is executed in accordance with either the previously set ordinary marking-indicating data or last-jig marking-indicating data. Specifically, all the position data of the IC packages for which the marking package-designating data is one are read, and the marking image is successively printed at these positions.

Then, when the marking action is finished, the jig whereon the marking action was finished is fed (step 450). This marking action is repeated up to the last jig (step 460).

In contrast to the first embodiment above, in the second embodiment, when the IC packages are arranged in the last jig, freedom is left concerning their arrangement. Consequently, the last-jig marking-indicating data could be input by the operator on each occasion, or could be automatically calculated. In the case of automatic calculation of the arrangement, this could be predetermined so as always to provide a fixed arrangement on the last jig corresponding to the number of ICs, the relationship between the predetermined IC arrangement and number of ICs being stored beforehand in the interior of the system.

Next, a third embodiment of the present invention will be described.

In the first embodiment above, the IC feed pitch (Pitch) of the IC handler 2 for incomplete-number action was made the same as the feed pitch for the other ordinary action. However, in this third embodiment, the feed pitch before or after performing incomplete-number action is changed from the feed pitch during ordinary action (is made shorter). Thereby, the feed distance between the time of ordinary marking and the time of incomplete-number marking is made shorter than in the first embodiment, thereby raising the marking processing capability.

Figure 12:
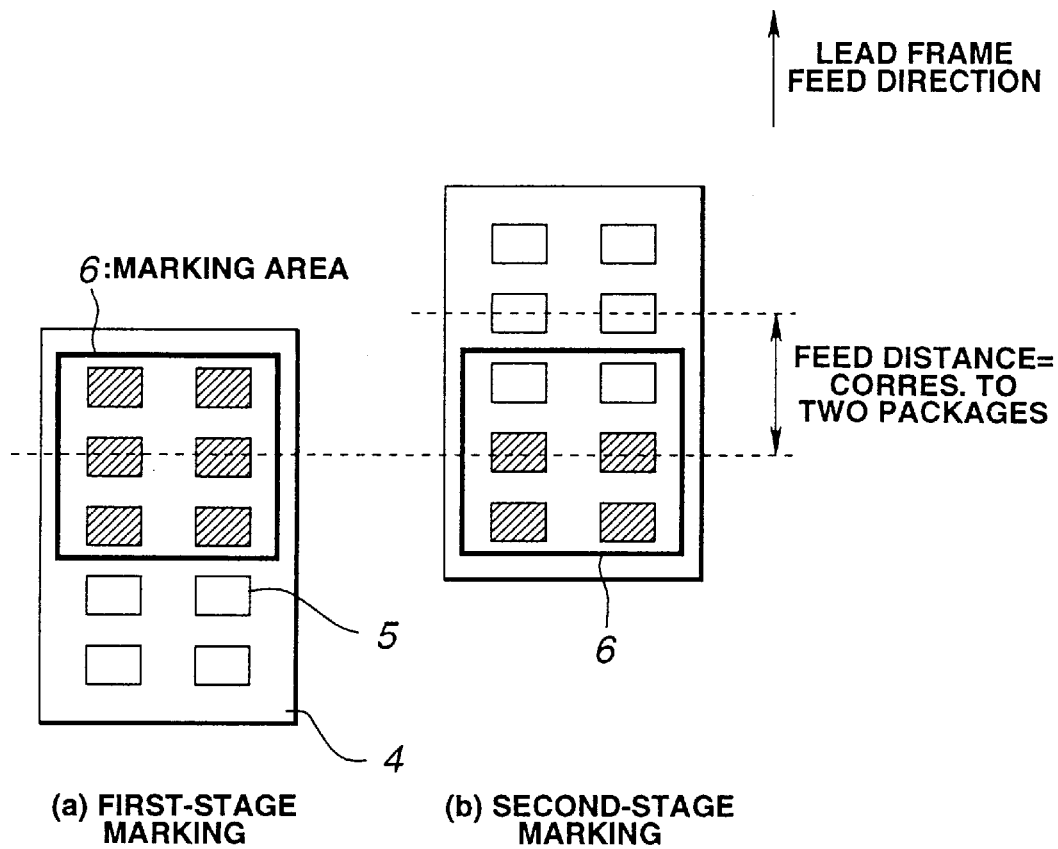
FIG. 12 is a diagram showing a third embodiment of this invention.
Figure 13:
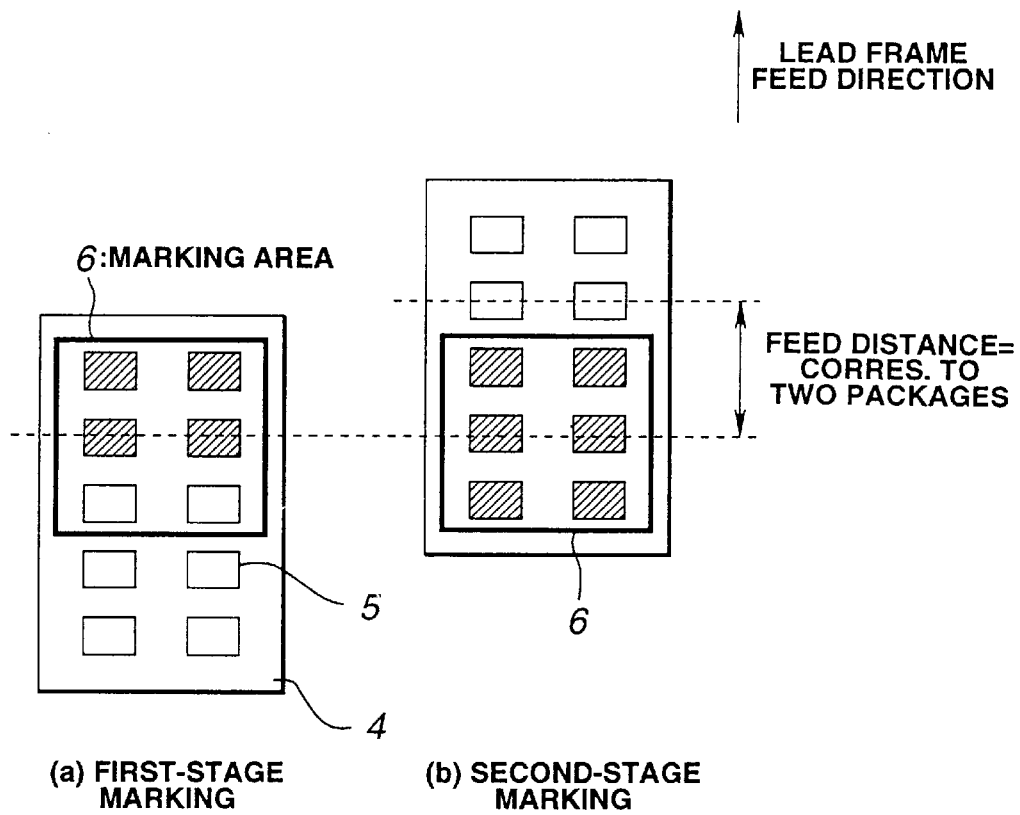
FIG. 13 is a diagram showing the marking feed action in the third embodiment of this invention.

In order to perform such processing, in this third embodiment, a suitable changeover is effected between the feeding and marking procedure shown in FIG. 12 and the feeding and marking procedure shown in FIG. 13.

Specifically, in the procedure shown in FIG. 12, first of all IC handler 2 feeds lead frame 4 into a position in which the first six ICs 5 are accommodated in marking area 6 and stops there (FIG. 12(a)). In this condition, the first-stage marking action is performed by laser marking device 1 and as a result the first six ICs 5 are marked. When the marking of these six ICs has been completed, IC handler 2 feeds the lead frame 4 by a distance corresponding to two rows of IC packages. The remaining four ICs 5 are thereby accommodated in marking area 6 (FIG. 12(b)). In this condition, second-stage marking action is performed by laser marking device 1, and as a result incomplete-number marking is performed in respect of the remaining four ICs 5.

In this way, in the procedure shown in FIG. 12, in carrying out marking in respect of a single lead frame, incomplete-number marking is performed in the final stage (this is the same as in the first embodiment above), and prior to this incomplete-number marking stage the IC feed pitch (Pitch) is made the minimum distance whereby ICs to be subjected to incomplete-number marking can be accommodated in marking area 6. Further, the incomplete-number marking indicating data are such data that marking is carried out up to the number of rows of (kosuu/Nex) from the final row 7 toward the lead frame feed direction.

Next, in the procedure shown in FIG. 13, first of all IC handler 2 feeds lead frame 4 into a position in which the first six ICs 5 are accommodated in marking area 6 and stops there (FIG. 13(a)). In this condition, first-stage marking action is to be performed by laser marking device 1. However, in this first-stage marking action, it is arranged to perform incomplete-number marking. That is, in this incomplete-number marking action, marking action is arranged to be performed on the first four ICs 5. Next, when this incomplete-number marking is completed in respect of these four ICs, IC handler 2 feeds lead frame 4 through a distance corresponding to two rows of IC packages. The remaining six ICs 5 are thereby accommodated in marking area 6 (FIG. 13(b)). In this condition, second-stage marking action is performed by laser marking device 1. As a result, ordinary marking is performed on the remaining six ICs 5.

Thus, in the procedure shown in FIG. 13, when marking a single lead frame, first of all, incomplete-number marking is performed and this incomplete-number marking is executed in the number for which incomplete-number marking is to be performed, starting from the IC packages in the first row. The feed pitch (Pitch) in the IC feed that is performed immediately after this initial incomplete-number marking is therefore made shorter than the ordinary pitch.

Thus, when the technique of either of FIG. 12 or FIG. 13 is employed, the feed distance for the IC feeding before and after the incomplete-number marking can be made shorter than in the first embodiment above.

Figure 14:
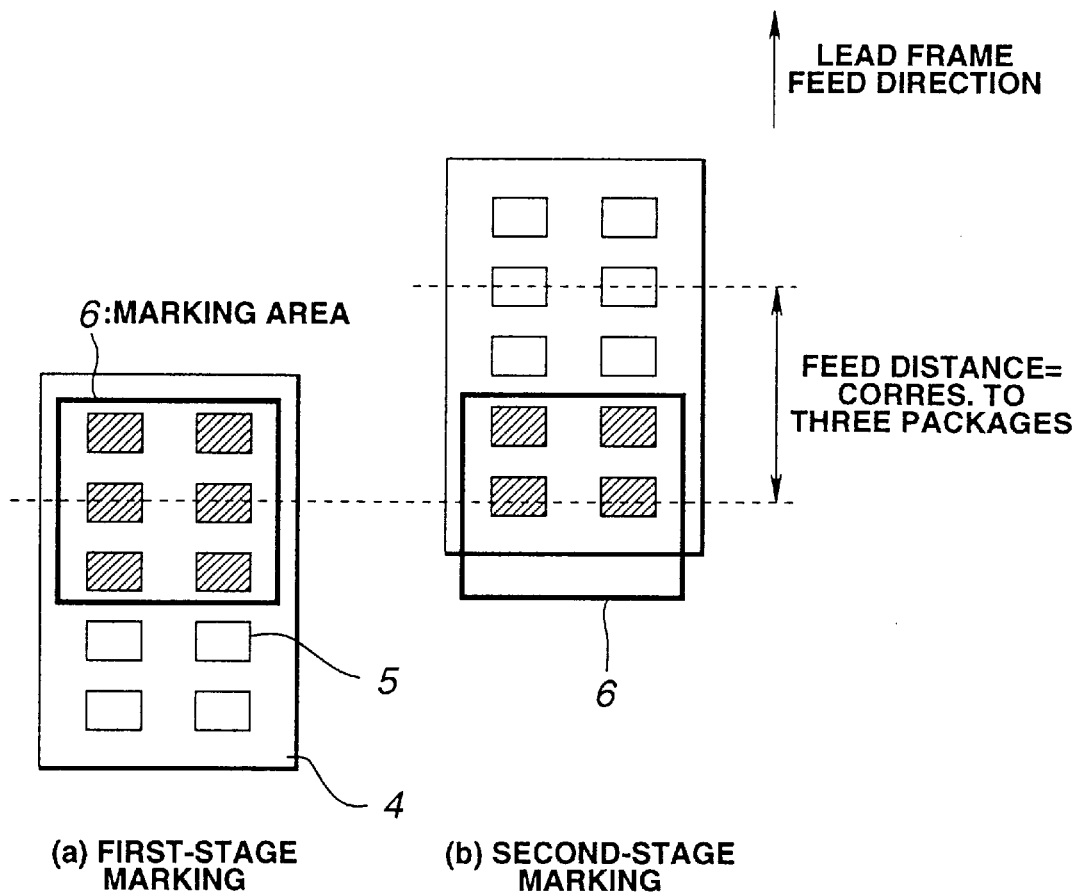
FIG. 14 is a diagram showing the marking feed action in the first embodiment of this invention.

Incidentally, with the technique of the first embodiment above, as shown in FIG. 14, the feed distance on this occasion corresponded to three rows of IC packages.

Figure 15:
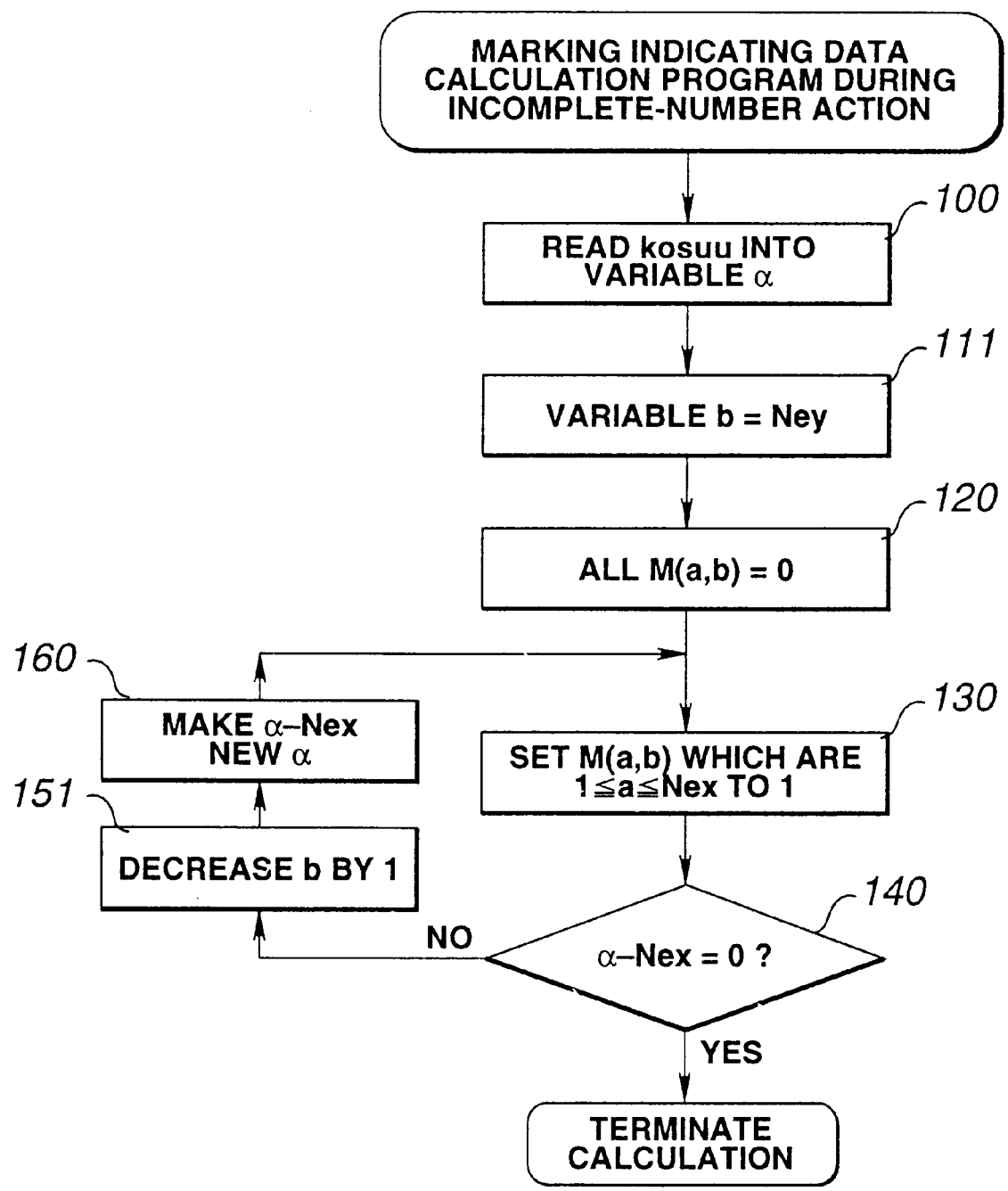
FIG. 15 is a flow-chart of a method of calculating marking indicating data in the case of incomplete-number action in the third embodiment of this invention.

FIG. 15 shows a marking-indicating data calculation program when incomplete marking is performed as shown in FIG. 12. In this program shown in FIG. 15, step 110 of the control procedure shown in FIG. 8 above is substituted by step 111; likewise step 150 is substituted by step 151.

The control procedure of FIG. 15 will now be described taking as an example the case of FIG. 12.

In the case of FIG. 12, $\alpha=4$, b=Ney=3, and Nex=2, so, first of all, by the processing of step 130 of FIG. 15, marking-indicating data M(1,3) and M(2,3), of the positions corresponding to the ICs of the third row in the transverse direction, become 1.

Next, in this case, $\alpha-\text{Nex}=2$, so the procedure shifts to steps 151 and 160 and as a result $\alpha=2$, b=2, and Nex=2.

Then, by again performing the processing of step 130, the marking-indicating data M(1,2) and M(2,2), of the positions corresponding to the ICs of the second row in the transverse direction, become 1.

Next, on this occasion, since $\alpha-\text{Nex}=2$, the procedure thereupon terminates.

Thus, when performing the incomplete-number marking shown in FIG. 12(b), the incomplete-number marking indicating data M(1,1)=0, M(1,2)=1, M(1,3)=1, M(2,1)=0, M(2,2)=1, M(2,3)=1, are obtained so that marking is performed only on the second and third rows in the transverse direction.

Figure 16:
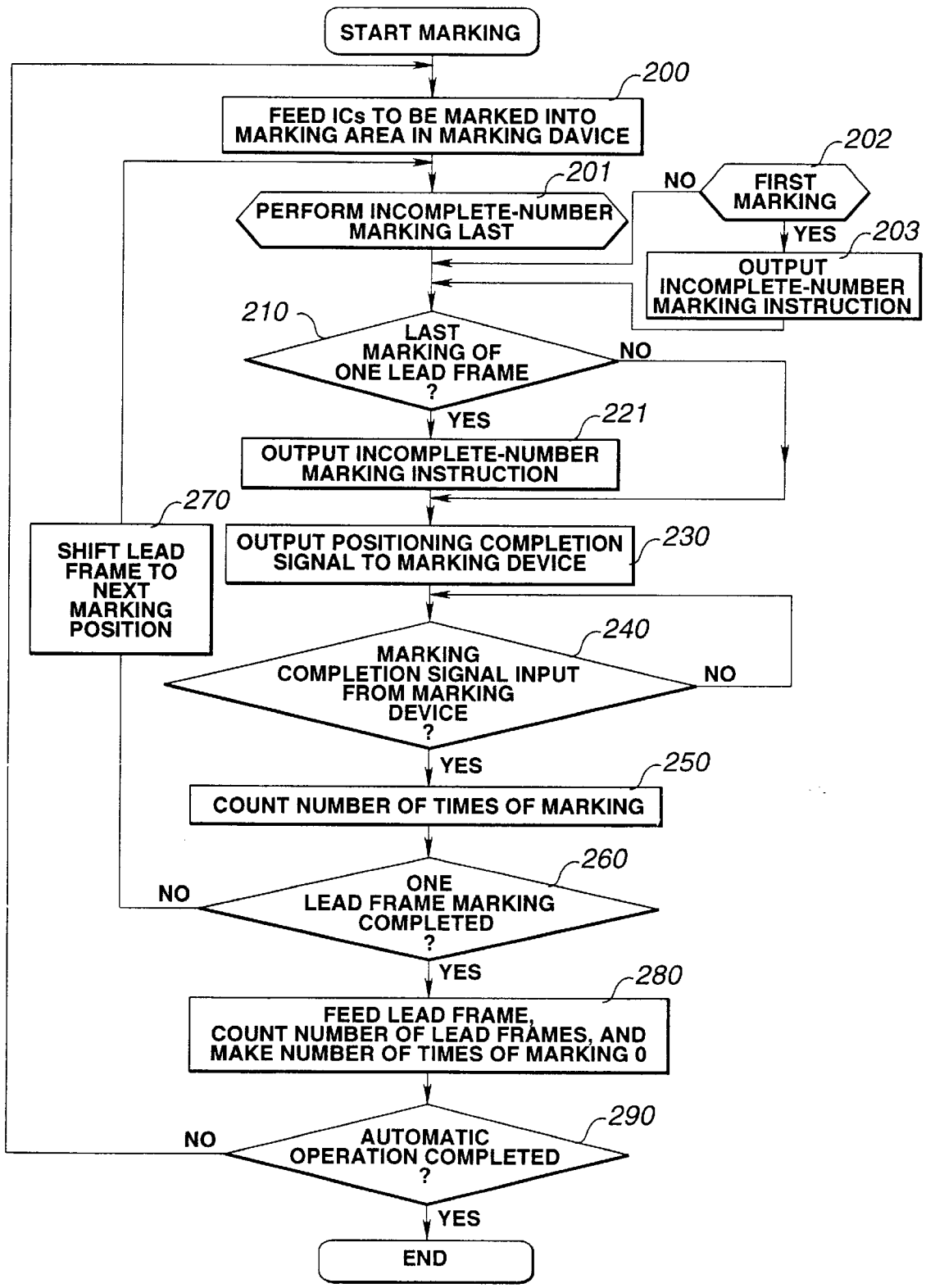
FIG. 16 is a flow-chart showing a control procedure of an IC handler in the third embodiment of this invention.
Figure 17:
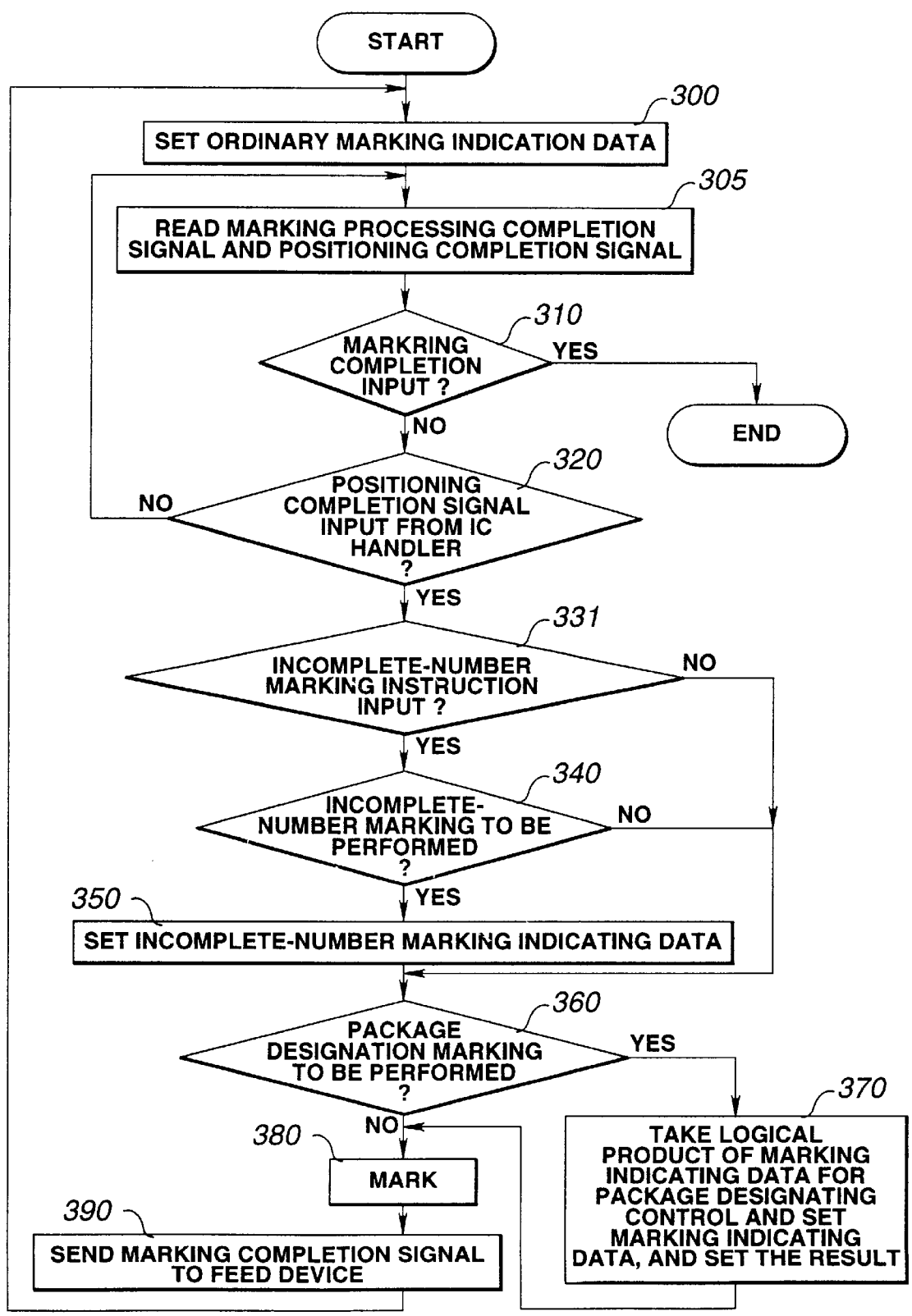
FIG. 17 is a flow-chart showing a control procedure of a laser marking device in the third embodiment of this invention.

FIG. 16 shows the control procedure of IC handler 2 in the third embodiment employed so as to suitably change over the two types of incomplete-number marking processing shown in FIG. 12 and FIG. 13. FIG. 17 shows the control procedure of laser marking device 1 of this third embodiment.

Specifically, in the flow-chart of FIG. 16, with respect to the control procedure of FIG. 9 above, the procedure of steps 201–203 is added and step 230 of FIG. 9 is replaced by step 231. Also in the flow-chart of FIG. 17 the procedure of step 330 of FIG. 10 is replaced by step 331. Description of the overlapping portions of these will be omitted.

In more detail, in the flow-chart of FIG. 16, the procedure of steps 201–203 is added in order to enable the operator to select at will whether incomplete-number marking is to be performed last, as shown in FIG. 12, or is to be performed first, as shown in FIG. 13. Also, in this third embodiment, since the incomplete-number marking is to be performed first or last, step 230 in FIG. 9 above is replaced by step 231 of FIG. 16 and step 330 in FIG. 10 above is replaced by step 331 of FIG. 17.

However, in this third embodiment, the feed pitch (Pitch) is not constant as it was in the first embodiment, so control device 3 uses the shape data of item 11 mentioned above to calculate the required feed pitch (Pitch) and sends this beforehand to IC handler 2. It should be noted that the feed pitch data before or after incomplete-number marking are different from the ordinary feed pitch data, so the feed pitch data in this connection are data for two different feed pitches.

Thus in this third embodiment the processing capability of the marking operation can be raised by making the pitch with which feed is performed on incomplete-number action shorter than in the first embodiment.

Figure 18:
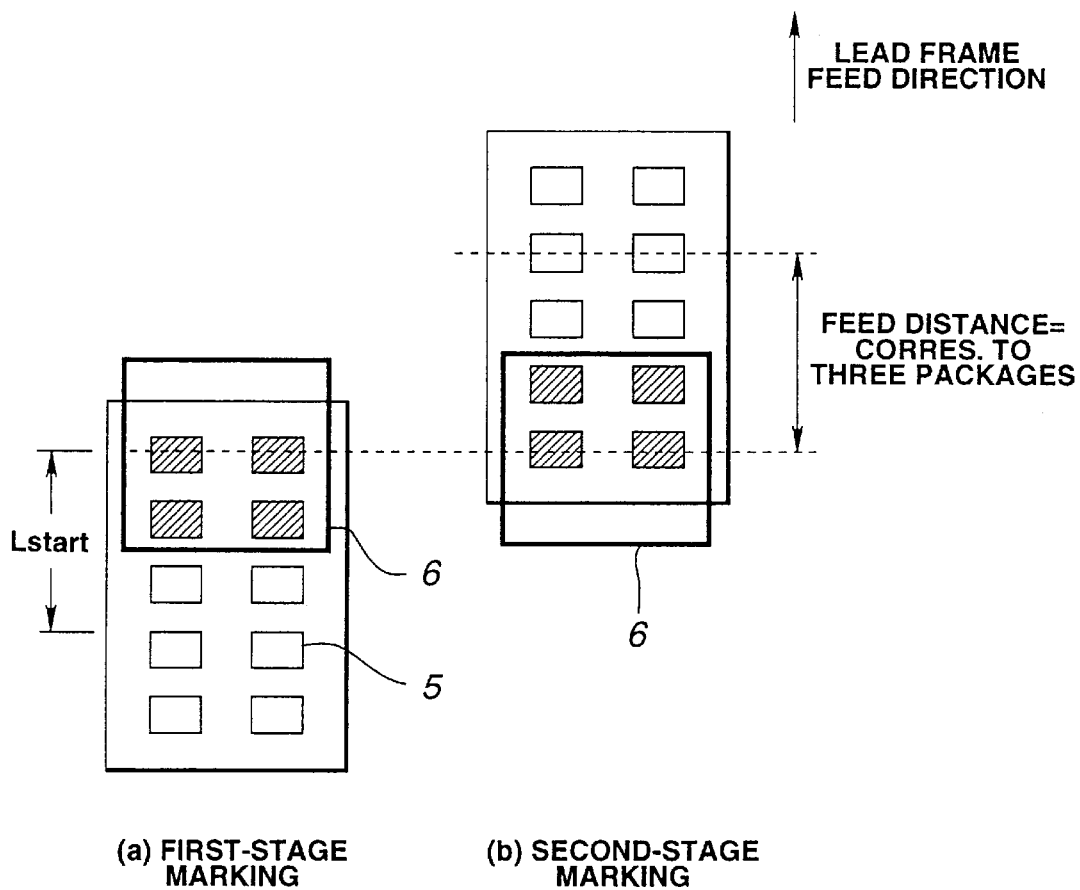
FIG. 18 shows a modification example of the marking feed action.

It should be noted that, when performing the initial incomplete-number marking, as shown in FIG. 18, it could be arranged that initially feeding is performed from the standby position to the position in which first-stage marking is performed, such that only the IC packages on which incomplete-number marking is to be performed are accommodated in marking area 6, but after this feeding is performed with the ordinary pitch. In this case, the distance data (Lstart) can be made shorter.

Also, although in the above embodiment the incomplete-number marking was arranged to be performed at the beginning or the end of the marking operation of a single lead frame, it could be arranged to carry out incomplete-number marking with any other timing chosen at will.

Although in the embodiments above, the example of a lead frame was taken wherein there were arranged five rows and two columns of ICs, this invention could of course be applied to lead frames with other row/column arrangements.

Also, the algorithm for calculating marking package-designating data in the case of incomplete-number action is not restricted to that shown in FIG. 8. For example, all the M(a, b) could first of all be set to 1 and then thereafter the M(a, b) corresponding to the positions where no IC is present could be set to 0.

Also, although in the embodiments above, the marking-indicating data M(a, b) were automatically calculated in control device 3, it could be arranged for these marking-indicating data M(a, b) to be input from outside the system. If the marking-indicating data M(a, b) are treated as input data, system design freedom is increased when for example performing marking on unmarked IC packages after the system has been shut down during marking because of noise or deformation of the read frame, for example, or when it is desired to mark only desired ICs during test operation after adjusting the system. Also, it may be arranged for it to be possible to select at will marking-indicating data input from outside or marking-indicating data automatically calculated within the system.

Also, although in the preceding embodiments, examples were illustrated wherein a laser marker was employed as processing and measuring device, the present invention could also be applied to other processing devices that process IC packages one by one by forming an atmosphere having a processing capability, such as plasma cutters or ink jets etc, or measuring devices that subject IC packages one by one to measurement, such as IC testers.

Also, although in the embodiments described above, a separate control device 3 was provided, it would be possible to load the functions of the present invention into a control device originally incorporated in laser marking device 1 or IC handler 2. However, providing a control device 3 which is separate from the laser marking device 1 or IC handler 2, as in the embodiments described above, offers more freedom of use of the system in respect of data collection and management.

Also, if control device 3 is arranged to suitably store input data of the aforementioned eleven items relating to lead frames or IC packages that are frequently produced, or is arranged to suitably store procedure data representing the procedure for processing and measurement of lead frames that are frequently used, ease of operation can be increased in processing and measurement of lead frames of the same shape.

Also, in the embodiments described above, as shown in FIG. 3, it was arranged to adjust the relative positions of the laser marking device and the IC handler such that the center line 7 of the lead frame should pass through the center line of the marking area 6 of the laser marking device. However, if center line 7 departs by an amount δx from the center line of marking area 6, at the time point where the transverse-direction marking area size Ex and the longitudinal-direction area size Ey are input, Ex and Ey could be calculated and input taking into account the amount of this offset δx. Also, when calculating the position Pk,l (x, y) of an IC package in the marking area, expression (4) above could be formed so that the positions of the ICs can be found as:

Pk,l (−Px×(Nex−1)/2+Px×(k−1)+δx, Py×(Ney−1)/2−Py×(1−1))

Also, in the embodiments described above, the leading end of the lead frame was taken as the reference point for indicating the position of the lead frame, but any other position on the lead frame could be taken as reference point.

Furthermore, although in the embodiments described above an IC handler was employed which was incapable of movement in the Y direction, it could be arranged to perform marking with a lead frame in which a large number of IC packages are arranged in order in the X direction also, by using an IC handler that can be freely moved in the X direction also.

Furthermore, although, in the embodiments described above, a single laser marking device was allocated to a plurality of ICs arranged in the marking area, it could be arranged to allocate individual laser marking devices to the plurality of ICs. In such a system, in the case of incomplete-number action, it could be arranged to disable the drive of laser marking devices where ICs to be marked are not present.

INDUSTRIAL APPLICABILITY

This invention is utilized in a system which carries out a predetermined processing or measurement while automatically feeding a plurality of IC packages juxtaposed on an IC package support such as a lead frame, a jig, etc.

We claim:

1. An IC package processing and measuring system comprising:
    a processing and measuring device that executes processing or measurement on a prescribed number of IC packages juxtaposed in a prescribed area;
    a feed device that feeds IC packages into the prescribed area, a prescribed number at a time, by feeding with a prescribed feed pitch an IC package support on which are loaded a plurality of juxtaposed IC packages; and
    a control device that controls the processing and measuring device and feed device, wherein, the control device comprises position calculating means that uses shape data of the IC package and IC package support to calculate target positions of processing and measurement of the IC packages in the prescribed area and outputs the calculated position data to the processing and measuring device, and
    the processing and measuring device comprises processing and measuring means that uses the target position data that were input from the position calculating means to execute processing or measurement on the IC packages that were fed into the prescribed area.

2. An IC package processing and measuring system according to claim 1, wherein the control device comprises feed distance calculating means that uses the shape data of the IC package and IC package support to calculate feed distance data for feeding IC packages to the calculated target positions and outputs the calculated feed distance data to the feed device and, the feed device comprises feed control means that uses the feed distance data that were input from the feed distance calculating means to execute feed control of the IC packages.

3. An IC package processing and measuring system according to claim 1, wherein the control device comprises:
    memory means that allocates to each IC package on the IC package support an identification number and that stores the target position data calculated by the position calculating means in association with the allocated IC package identification numbers; and
    means that reads from the memory means the target position data corresponding to the IC package identification numbers that were input and that outputs the target position data that has been read to the processing and measuring means of the processing and measuring device.

4. An IC package processing and measuring system comprising:
    a processing and measuring device that executes processing or measurement on a prescribed number of IC packages juxtaposed in a prescribed area;
    a feed device that feeds IC packages into the prescribed area, a prescribed number at a time, by sequentially feeding an IC package support on which are loaded a plurality of juxtaposed IC packages; and
    a control device that controls the processing and measuring device and feed device; wherein the control device comprises:
        position calculating means that uses shape data of the IC package and IC package support to calculate target positions of processing and measurement of the IC packages in the prescribed area;
        processing and measurement indicating data forming means that forms processing and measurement indicating data that indicates whether or not there is to be processing or measurement at the target positions of the IC packages calculated by the position calculating means, based on data indicating a maximum number and arrangement of the IC packages that are capable of being fed into the prescribed area and data indicating a total number and arrangement of the IC packages that are fed; and
        means that outputs the calculated target position data and processing and measurement indicating data to the processing and measuring device, and
        the processing and measuring device comprises processing and measuring means that executes processing or measurement only in respect of target positions where the processing and measurement indicating data indicate that there is to be processing or measurement, based on the input target position data and processing and measurement indicating data.

5. An IC package processing and measuring system according to claim 4, wherein the feed device is fed at a prescribed feed pitch constantly.

6. An IC package processing and measuring system according to claim 4, wherein the feed device is fed at a prescribed feed pitch constantly, and wherein the control device comprises feed control means which, in a case where there occurs a condition that the number of IC packages to be fed into the prescribed area does not reach a maximum number of IC packages that are capable of being fed into the prescribed area, controls the feed device so that a feed pitch of IC packages at a stage immediately before or after shifting to such a condition is shortened than the prescribed feed pitch.

7. A method of processing and measuring IC packages by controlling processing and measuring device which executes processing or measurement on a prescribed number of IC packages juxtaposed in a prescribed area, and a feed device which feeds IC packages into the prescribed area, a prescribed number at a time, by feeding with a prescribed feed pitch an IC package support on which are loaded a plurality of juxtaposed IC packages, the method comprising the steps of:

calculating target positions of processing and measurement of the IC packages in the prescribed area based on shape data of the IC package and IC package support;

forming processing and measurement indicating data that indicates whether or not there is to be processing or measurement at the target positions of the IC packages calculated, based on data indicating a maximum number and arrangement of the IC packages that are capable of being fed into the prescribed area and data indicating a total number and arrangement of the IC packages that are fed; and executing processing or measurement only in respect of target positions where the processing and measurement indicating data indicate that there is to be processing or measurement, based on the calculated target position data and processing and measurement indicating data.

* * * * *